(12) United States Patent
Herner et al.

(10) Patent No.: US 8,383,478 B2
(45) Date of Patent: *Feb. 26, 2013

(54) HIGH-DENSITY NONVOLATILE MEMORY AND METHODS OF MAKING THE SAME

(75) Inventors: Scott Brad Herner, San Jose, CA (US); Maitreyee Mahajani, Saratoga, CA (US)

(73) Assignee: SanDisk 3D LLC, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/195,518

(22) Filed: Aug. 1, 2011

(65) Prior Publication Data

US 2011/0287615 A1 Nov. 24, 2011

Related U.S. Application Data

(60) Division of application No. 12/477,216, filed on Jun. 3, 2009, now Pat. No. 8,004,033, which is a division of application No. 11/401,073, filed on Apr. 10, 2006, now Pat. No. 7,557,405, which is a continuation of application No. 10/855,775, filed on May 26, 2004, now Pat. No. 7,026,212, which is a continuation of application No. 10/326,470, filed on Dec. 19, 2002, now abandoned.

(51) Int. Cl.
*H01L 21/336* (2006.01)
(52) U.S. Cl. ............... 438/257; 438/258; 438/593
(58) Field of Classification Search .......... 438/257–258, 438/593; 257/530, 313–316; 367/65, 117, 367/14
See application file for complete search history.

(56) References Cited

U.S. PATENT DOCUMENTS

| | | | |
|---|---|---|---|
| 4,499,557 | A | 2/1985 | Holmberg et al. |
| 4,646,266 | A | 2/1987 | Ovshinsky et al. |
| 4,665,428 | A | 5/1987 | Hockley et al. |
| 5,432,729 | A | 7/1995 | Carson et al. |
| 5,441,907 | A | 8/1995 | Sung et al. |
| 5,559,732 | A | 9/1996 | Birge |
| 5,700,737 | A | 12/1997 | Yu et al. |
| 5,745,407 | A | 4/1998 | Levy et al. |
| 5,751,012 | A | 5/1998 | Wolstenholme et al. |
| 5,792,569 | A | 8/1998 | Sun et al. |
| 5,835,396 | A | 11/1998 | Zhang |
| 5,877,538 | A | 3/1999 | Williams |
| 5,915,167 | A | 6/1999 | Leedy |

(Continued)

FOREIGN PATENT DOCUMENTS

WO WO 2004/061851 7/2004

OTHER PUBLICATIONS

Notice of Allowance of related U.S. Appl. No. 13/074,509 mailed Nov. 25, 2011.

(Continued)

*Primary Examiner* — Dung A. Le
(74) *Attorney, Agent, or Firm* — Dugan & Dugan, PC

(57) ABSTRACT

Nonvolatile memory cells and methods of forming the same are provided, the methods including forming a first conductor at a first height above a substrate; forming a first pillar-shaped semiconductor element above the first conductor, wherein the first pillar-shaped semiconductor element comprises a first heavily doped layer of a first conductivity type, a second lightly doped layer above and in contact with the first heavily doped layer, and a third heavily doped layer of a second conductivity type above and in contact with the second lightly doped layer, the second conductivity type opposite the first conductivity type; forming a first dielectric antifuse above the third heavily doped layer of the first pillar-shaped semiconductor element; and forming a second conductor above the first dielectric antifuse.

11 Claims, 8 Drawing Sheets

U.S. PATENT DOCUMENTS

| | | | |
|---|---|---|---|
| 5,991,193 | A | 11/1999 | Gallagher et al. |
| 6,034,882 | A | 3/2000 | Johnson et al. |
| 6,111,784 | A | 8/2000 | Nishimura |
| 6,141,241 | A | 10/2000 | Ovshinsky et al. |
| 6,185,122 | B1 | 2/2001 | Johnson et al. |
| 6,236,587 | B1 | 5/2001 | Gudesen et al. |
| 6,420,215 | B1 | 7/2002 | Knall et al. |
| 6,483,736 | B2 | 11/2002 | Johnson et al. |
| 6,525,953 | B1 | 2/2003 | Johnson |
| 6,534,841 | B1 | 3/2003 | Van Brocklin et al. |
| 6,567,301 | B2 | 5/2003 | Anthony et al. |
| 6,584,029 | B2 | 6/2003 | Tran et al. |
| 6,611,453 | B2 | 8/2003 | Ning |
| 6,627,530 | B2 | 9/2003 | Li et al. |
| 6,635,556 | B1 | 10/2003 | Herner |
| 6,664,639 | B2 | 12/2003 | Cleeves et al. |
| 6,677,220 | B2 | 1/2004 | Van Brocklin et al. |
| 6,689,644 | B2 | 2/2004 | Johnson |
| 6,693,823 | B2 | 2/2004 | Brown |
| 6,784,517 | B2 | 8/2004 | Kleveland et al. |
| 6,853,049 | B2 | 2/2005 | Herner |
| 6,879,505 | B2 | 4/2005 | Scheuerlein |
| 6,946,719 | B2 | 9/2005 | Petti et al. |
| 6,951,780 | B1 | 10/2005 | Herner |
| 6,952,030 | B2 | 10/2005 | Herner et al. |
| 6,952,043 | B2 | 10/2005 | Vyvoda et al. |
| 6,984,561 | B2 * | 1/2006 | Herner et al. ............... 438/257 |
| 7,026,212 | B2 | 4/2006 | Herner et al. |
| 7,038,248 | B2 | 5/2006 | Lee |
| 7,115,967 | B2 | 10/2006 | Cleeves |
| 7,172,840 | B2 | 2/2007 | Chen |
| 7,176,064 | B2 | 2/2007 | Herner |
| 7,224,013 | B2 | 5/2007 | Herner et al. |
| 7,238,607 | B2 | 7/2007 | Dunton et al. |
| 7,265,049 | B2 | 9/2007 | Herner et al. |
| 7,285,464 | B2 | 10/2007 | Herner et al. |
| 7,307,013 | B2 | 12/2007 | Raghuram et al. |
| 7,423,304 | B2 | 9/2008 | Cleeves et al. |
| 7,474,000 | B2 | 1/2009 | Scheuerlein |
| 7,511,352 | B2 | 3/2009 | Vyvoda |
| 7,517,796 | B2 | 4/2009 | Raghuram et al. |
| 7,557,405 | B2 | 7/2009 | Herner et al. |
| 7,560,339 | B2 | 7/2009 | Herner et al. |
| 7,767,499 | B2 | 8/2010 | Herner |
| 2003/0025176 | A1 | 2/2003 | Subramanian et al. |
| 2003/0164491 | A1 | 9/2003 | Lee |
| 2005/0012119 | A1 | 1/2005 | Herner et al. |
| 2005/0026334 | A1 | 2/2005 | Knall |
| 2005/0052915 | A1 | 3/2005 | Herner et al. |
| 2005/0098800 | A1 | 5/2005 | Herner et al. |
| 2005/0221200 | A1 | 10/2005 | Chen |
| 2005/0226067 | A1 | 10/2005 | Herner et al. |
| 2006/0067117 | A1 | 3/2006 | Petti |
| 2006/0249753 | A1 | 11/2006 | Herner et al. |
| 2009/0261343 | A1 | 10/2009 | Herner et al. |
| 2010/0181657 | A1 | 7/2010 | Herner et al. |
| 2011/0176352 | A1 | 7/2011 | Herner |

OTHER PUBLICATIONS

Singh, D V., et al., "Abrupt phosphorus profiles in Si: Effects of temperature and substitutional carbon on phosphorus autodoping", Journal of the Electrochemical Society, 150, (2003) G553-G556.
Written Opinion of International Application No. PCT/US2006/022023 mailed Sep. 21, 2006.
International Search Report of International Application No. PCT/US2006/022023 mailed Sep. 21, 2006.
International Preliminary Report on Patentability of International Application No. PCT/US2006/022023 issued Dec. 11, 2007.
Office Action of Europe Application No. 06 760 714.3 mailed Apr. 30, 2008.
Office Action and Search Report of Taiwan Application No. 095120206 issued Jun. 30, 2008.
Office Action of U.S. Appl. No. 10/955,549 mailed Jun. 27, 2006.
Final Office Action of U.S. Appl. No. 10/955,549 mailed Oct. 19, 2006.
Final Office Action of U.S. Appl. No. 10/955,549 mailed Sep. 24, 2007.
Aug. 4, 2006 Reply to Jun. 27, 2006 Office Action of U.S. Appl. No. 10/955,549.
Office Action of U.S. Appl. No. 11/015,824 mailed Dec. 14, 2006.
Notice of Allowance of U.S. Appl. No. 11/015,824 mailed Jun. 14, 2007.
Apr. 12, 2007 Reply to Dec. 14, 2006 Office Action of U.S. Appl. No. 11/015,824.
Office Action of U.S. Appl. No. 11/148,530 mailed Apr. 19, 2007.
Final Office Action of U.S. Appl. No. 11/148,530 mailed Nov. 23, 2007.
Office Action of U.S. Appl. No. 11/148,530 mailed Sep. 29, 2008.
Final Office Action of U.S. Appl. No. 11/148,530 mailed Apr. 30, 2009.
Jul. 30, 2009 Reply to Apr. 30, 2009 Final Office Action of U.S. Appl. 11/148,530.
Jan. 29, 2009 Reply to Sep. 29, 2008 Office Action of U.S. Appl. No. 11/148,530.
Aug. 20, 2007 Reply to Apr. 19, 2007 Office Action of U.S. Appl. No. 11/148,530.
Notice of Allowance of U.S. Appl. No. 11/215,951 mailed Apr. 25, 2007.
Office Action of U.S. Appl. No. 11/237,169 mailed Nov. 3, 2006.
Notice of Allowance of U.S. Appl. No. 11/237,169 mailed Mar. 26, 2007.
Akerman, "Toward a Universal Memory", Apr. 22, 2005, vol. 308, Science, 508-510.
Jan. 31, 2007 Reply to Nov. 3, 2006 Office Action of U.S. Appl. No. 11/237,169.
Examiner's Answer of U.S. Appl. No. 10/955,549 mailed Sep. 30, 2008.
Asuha, T. et al. "Ultrathin silicon dioxide layers with a low leakage current density formed by chemical oxidation of Si", Applied Physics Letters, vol. 81, No. 18 (Oct. 28, 2002), 3410-3412.
Babcock, J.A. ,et al., "Polysilicon Resistor Trimming for Packaged Integrated Circuits", IEDM 93 (1993),247-250.
Ellis, K. A. et al. "Phosphorus Diffusion in Silicon Oxide and Oxynitride Gate Dielectrics", Electrochem, Sol. St. Lett. 2, (1999), 516-518.
Feldbaumer, D.W. et al. "Theory and Application of Polysilicon Resistor Trimming", Solid-State Electronics, vol. 38 11, (1995), 1861-1869.
Hamada, T. et al., "Thin Inter-Polyoxide Films for Flash Memories Grown at Low Temperature (400°) by Oxygen Radicals", IEEE Elect. Dev. Lett. vol. 22, No. 9, (Sep. 2001), 423-425.
Mahan, J. E. , "Threshold and Memory Switching in Polycrystalline Silicon", Applied Physics Letter, 41, 5. (Sep. 1982) 479-481.
Malhotra et al., "Fundamentals of Memory Switching in Vertical Polycrystalline Silicon Structures", IEEE Transactions on Electron Devices, ED-32 (11), 2441, (1985).
Malhotra, Vinod.,et al., "An Electrothermal Model of Memory Switching in Vertical Polycrystalline Silicon Structures", IEEE Transactions on Electron Devices, vol. 35, 9, (Sep. 1988),1514-1523.
Nutzel, J.F., et al., "Comparison of P and Sb as n-dopants for Si molecular beam epitaxy", J. Appl. Phys. 78 (2), (Jul. 15, 1995), 937-940.
Park, B., et al., "Study of contact resistance in in-situ phosphorus layer doped Si deposition process", Electrochemical Society Proceedings 99-31, (1999), 34-45.
Raider, S. I. et al., "Abstract: Stoichiometry of SiO2/Si interfacial regions: I. Ultrathin oxide films", J. Vac. Sci. Tech. vol. 13, No. 1, (Jan./Feb./1976), 58.
Office Action of U.S. Appl. No. 11/866,403 mailed Feb. 13, 2008.
Notice of Allowance of U.S. Appl. No. 11/866,403 mailed Aug. 14, 2008.
Notice of Allowance of U.S. Appl. No. 11/866,403 mailed Jan. 21, 2009.
Notice of Allowance of U.S. Appl. No. 11/866,403 mailed Apr. 22, 2009.
Jun. 13, 2008 Reply to Feb. 13, 2008 Office Action of U.S. Appl. No. 11/866,403.
Herner et al., U.S. Appl. No. 10/326,470, filed Dec. 19, 2002.

Office Action of U.S. Appl. No. 11/401,073 mailed Oct. 26, 2007.
Notice of Allowance of U.S. Appl. No. 11/401,073 mailed Sep. 23, 2008.
Notice of Allowance of U.S. Appl. No. 11/401,073 mailed Mar. 3, 2009.
Mar. 26, 2008 Reply to Oct. 26, 2007 Office Action of U.S. Appl. No. 11/401,073.
Dec. 1, 2008 Reply Brief of U.S. Appl. No. 10/955,549.
Jul. 3, 2008 Amended Appeal Brief of U.S. Appl. No. 10/955,549.
Jun. 4, 2008 Notification of Non-Compliant Appeal Brief of U.S. Appl. No. 10/955,549.
May 27, 2008 Appeal Brief of U.S. Appl. No. 10/955,549.
Apr. 17, 2007 Appeal Brief of U.S. Appl. No. 10/955,549.
Jun. 6, 2008 Pre-Brief Appeal Conference decision of U.S. Appl. No. 11/148,530.
Apr. 23, 2008 Pre-Appeal Brief Request for Review of U.S. Appl. No. 11/148,530.
Aug. 12, 2008 Reply to Jun. 12, 2008 *Ex Parte* Quayle Office Action of U.S. Appl. No. 11/401,073.
*Ex Parte* Quayle Office Action of U.S. Appl. No. 11/401,073 mailed Jun. 12, 2008.
Oct. 9, 2009 Office Action of related Chinese Application No. 200680027149.2.
Office Action of related U.S. Appl. No. 11/148,530 mailed Nov. 9, 2009.
Feb. 9, 2010 Reply to Nov. 9, 2009 Office Action of related U.S. Appl. No. 11/148,530.
Final Office Action of related U.S. Appl. No. 11/148,530 mailed Jun. 4, 2010.
Examiner's Interview Summary of related U.S. Appl. No. 11/148,530 mailed Aug. 2, 2010.
Aug. 31, 2010 Reply Jun. 4, 2010 Final Office Action and Interview Summary with Examiner of related U.S. Appl. No. 11/148,530.
Restriction Requirement of U.S. Appl. No. 12/477,216 mailed Sep. 8, 2010.
Sep. 24, 2010 Reply to Restriction Requirement of related U.S. Appl. No. 12/477,216 mailed Sep. 8, 2010.
Restriction Requirement of U.S. Appl. No. 12/481,684 mailed Oct. 18, 2010.
Nov. 2, 2010 Reply to Restriction Requirement of related U.S. Appl. No. 12/481,684 mailed Oct. 18, 2010.
Office Action of related U.S. Appl. No. 12/477,216 mailed Nov. 5, 2010.
Office Action of related U.S. Appl. No. 12/481,684 mailed Dec. 8, 2010.
Office Action of related U.S. Appl. No. 11/148,530 mailed Dec. 14, 2010.
Restriction Requirement of U.S. Appl. No. 11/015,824 mailed Sep. 14, 2006.
Oct. 11, 2006 Reply to Restriction Requirement of U.S. Appl. No. 11/015,824 mailed Sep. 14, 2006.
Restriction Requirement of related U.S. Appl. No. 11/148,530 mailed Feb. 1, 2007.
Mar. 1, 2007 Reply to Restriction Requirement of related U.S. Appl. No. 11/148,530 mailed Feb. 1, 2007.
Restriction Requirement of related U.S. Appl. No. 11/401,073 mailed Sep. 12, 2007.
Oct. 12, 2007 Reply to Restriction Requirement of related U.S. Appl. No. 11/401,073 mailed Sep. 12, 2007.
Restriction Requirement of U.S. Appl. No. 10/955,549 mailed Mar. 17, 2006.
Apr. 7, 2006 Reply to Restriction Requirement of U.S. Appl. No. 10/955,549 mailed Mar. 17, 2006.
Restriction Requirement of U.S. Appl. No. 10/955,549 mailed Apr. 27, 2006.
May 22, 2006 Reply to Restriction Requirement of U.S. Appl. No. 10/955,549 mailed Apr. 27, 2006.
Interview Summary of U.S. Appl. No. 10/955,549, filed Oct. 16, 2007.
Feb. 7, 2011 Reply and Terminal Disclaimer to Nov. 5, 2010 Office Action of related U.S. Appl. No. 12/477,216.
Mar. 8, 2011 Reply to Dec. 8, 2010 Office Action of related U.S. Appl. No. 12/481,684.
Notice of Allowance of related U.S. Appl. No. 12/477,216 mailed Mar. 16, 2011.
Interview Summary of related U.S. Appl. No. 11/148,530 mailed Mar. 22, 2011.
Notice of Allowance of related U.S. Appl. No. 12/481,684 mailed May 11, 2011.
Notice of Abandonment of related U.S. Appl. No. 11/148,530 mailed Jun. 23, 2011.
Herner et al., U.S. Appl. No. 13/228,109, filed Sep. 8, 2011.
Decision on Appeal of related U.S. Appl. No. 10/955,549 mailed Apr. 27, 2012.
Notice of Allowance of related U.S. Appl. No. 13/228,109 mailed Feb. 15, 2012.
Notice of Allowance of related U.S. Appl. No. 13/228,109 mailed Apr. 3, 2012.
Notice of Allowance of related U.S. Appl. No. 13/074,509 mailed Apr. 12, 2012.
Herner et al., U.S. Appl. No. 13/568,834, filed Aug. 7, 2012.
Office Action of related U.S. Appl. No. 10/955,549 mailed Sep. 19, 2012.
Jun. 22, 2012 RCE and Response to Sep. 24, 2007 Final Office Action of related U.S. Appl. No. 10/955,549.
Dec. 19, 2012 Reply to Sep. 19, 2012 Office Action of related U.S. Appl. No. 10/955,549.
Office Action of related U.S. Appl. No. 13/568,834 mailed Nov. 30, 2012.

* cited by examiner

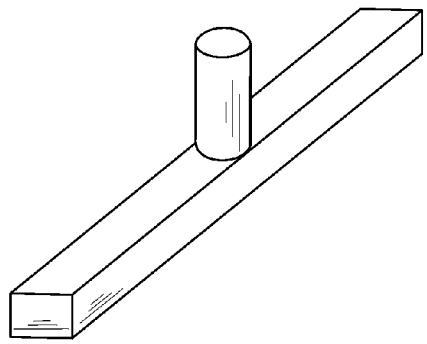
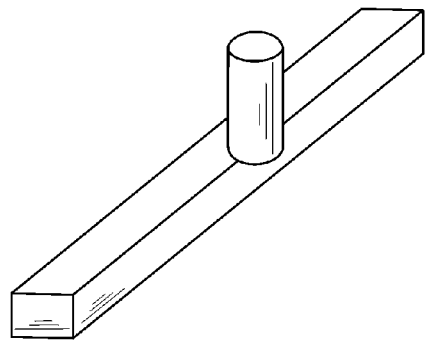
FIG. 5a     FIG. 5b
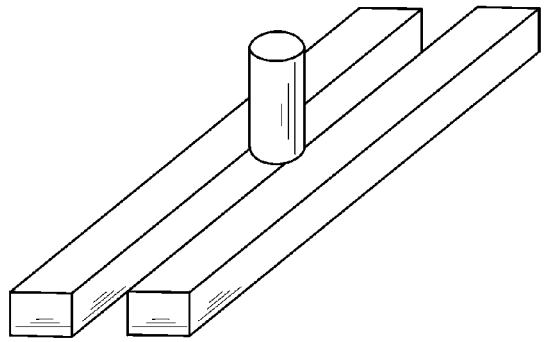
FIG. 5c
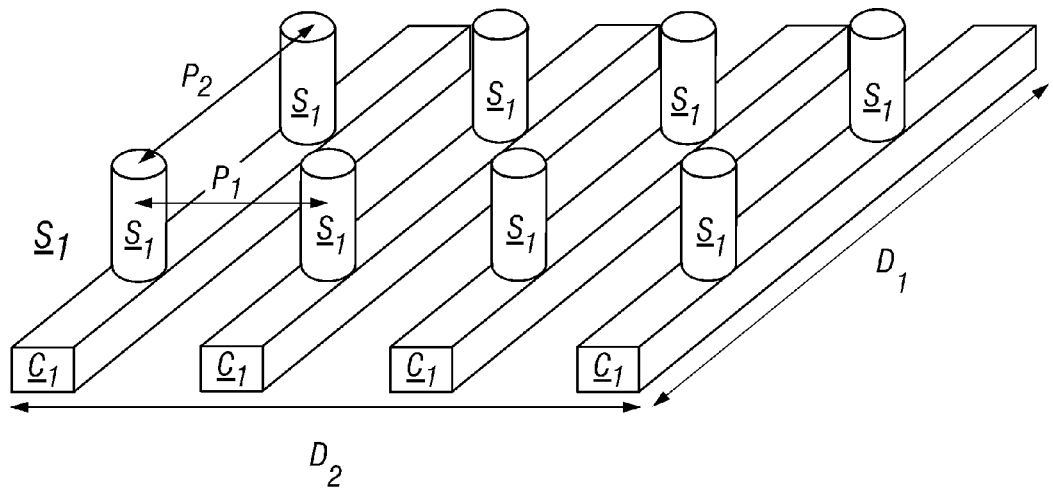
FIG. 6a

US 8,383,478 B2

HIGH-DENSITY NONVOLATILE MEMORY AND METHODS OF MAKING THE SAME

This application is a divisional application of U.S. patent application Ser. No. 12/477,216, filed Jun. 3, 2009, now U.S. Pat. No. 8,004,033, which is a divisional application of U.S. patent application Ser. No. 11/401,073, filed Apr. 10, 2006, now U.S. Pat. No. 7,557,405, which is a continuation of U.S. patent application Ser. No. 10/855,775, filed May 26, 2004, now U.S. Pat. No. 7,026,212, which is a continuation of U.S. patent application Ser. No. 10/326,470, filed Dec. 19, 2002, now abandoned, each of which is incorporated by reference herein in its entirety for all purposes.

BACKGROUND

Integrated circuits are typically fabricated in monocrystalline silicon substrate. This substrate is expensive, leading to continual efforts to fabricate more circuitry within a given area of substrate, increasing density.

For nonvolatile memory, a highly effective approach to increase density is to build monolithic three dimensional memories above the substrate, like those disclosed in Johnson et al., U.S. Pat. No. 6,034,882; Johnson et al., U.S. patent application Ser. No. 09/928,536, filed Aug. 13, 2001; Knall et al., U.S. Pat. No. 6,420,215; and Vyvoda et al., U.S. patent application Ser. No. 10/185,507, filed Jun. 27, 2002, all hereby incorporated by reference in their entirety.

Such memories can be improved to achieve higher densities.

SUMMARY

In a first aspect of the invention, a method is provided to form a nonvolatile memory cell, the method including: (i) forming a first conductor at a first height above a substrate; (ii) forming a first pillar-shaped semiconductor element above the first conductor, wherein the first pillar-shaped semiconductor element comprises a first heavily doped layer of a first conductivity type, a second lightly doped layer above and in contact with the first heavily doped layer, and a third heavily doped layer of a second conductivity type above and in contact with the second lightly doped layer, the second conductivity type opposite the first conductivity type; (iii) forming a first dielectric antifuse above the third heavily doped layer of the first pillar-shaped semiconductor element; and (iv) forming a second conductor above the first dielectric antifuse.

In a second aspect of the invention, a method is provided for forming a monolithic three dimensional memory array, wherein the method includes forming a first plurality of substantially parallel, substantially coplanar conductors above a substrate; forming a first plurality of semiconductor elements above the first plurality of substantially parallel, substantially coplanar conductors, wherein each of the first plurality of semiconductor elements comprises a first heavily doped layer having a first conductivity type, a second lightly doped layer on and in contact with the first heavily doped layer, and a third heavily doped layer on and in contact with the second lightly doped layer, the third heavily doped layer having a second conductivity type opposite the first conductivity type; and forming a second plurality of substantially parallel, substantially coplanar conductors above the first plurality of semiconductor elements.

BRIEF DESCRIPTION OF THE DRAWINGS

Features of the present invention can be more clearly understood from the following detailed description considered in conjunction with the appended claims and the following drawings, in which the same reference numerals denote the same elements throughout, and in which:

FIG. 5a through FIG. 5c illustrate misalignment between conductors and an overlying semiconductor element;

FIG. 6a and FIG. 6b illustrate spacing of the semiconductor elements in two dimensions;

DETAILED DESCRIPTION

Johnson et al. and Knall et al. both disclose monolithic three dimensional memories which provide for high density memory arrays. The present invention provides for creation of a monolithic three dimensional memory with a structure similar to those disclosed in Johnson et al., but uses a different method of fabrication and different choice of materials, allowing for improved density, performance, and ease of manufacture.

Figure 1A:
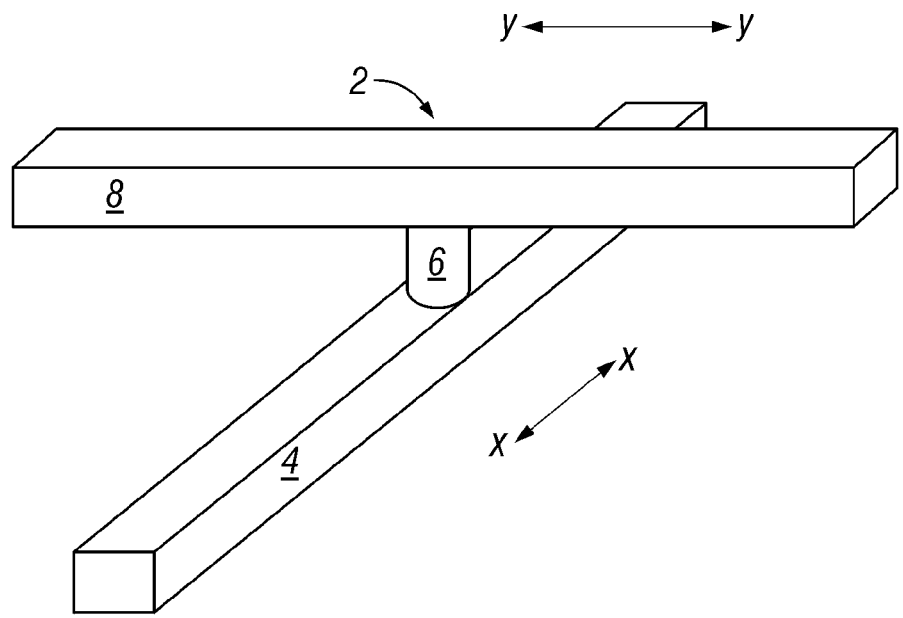
FIG. 1a and FIG. 1b illustrate three dimensional memory cells according to the present invention.
Figure 1B:
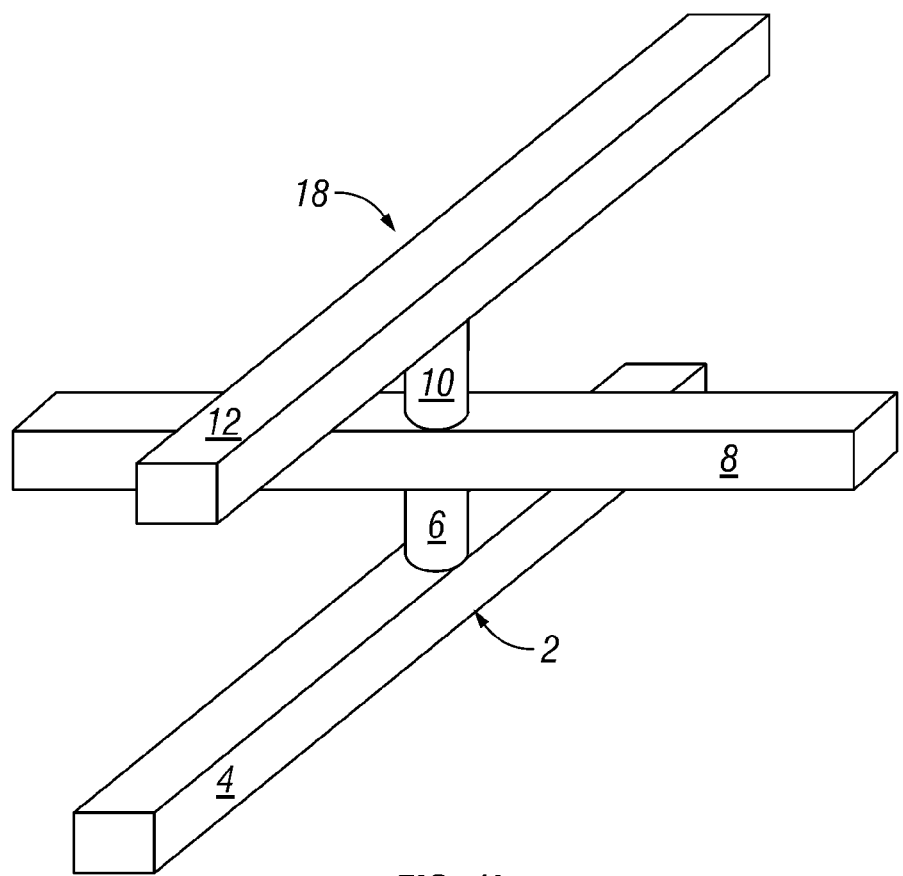

The structure of a single memory cell 2 of the present invention is illustrated in FIG. 1a. At the bottom is conductor 4. Above conductor 4 is semiconductor element 6, and above that is conductor 8. In the present invention, semiconductor element 6 is substantially cylindrical, for reasons that will be described below. The memory cell of Johnson et al. has a similar structure, but its semiconductor element, called a pillar, is not substantially cylindrical. Turning to FIG. 1b, in both the memory of Johnson et al. and the present invention, another semiconductor element 10 can be formed above conductor 8, and another conductor 12 above semiconductor element 10. Conductor 8 then serves as the top conductor for the lower memory cell 2 and as the bottom conductor for an overlying memory cell 18. Memory cells may be stacked vertically several stories high.

Figure 2A:
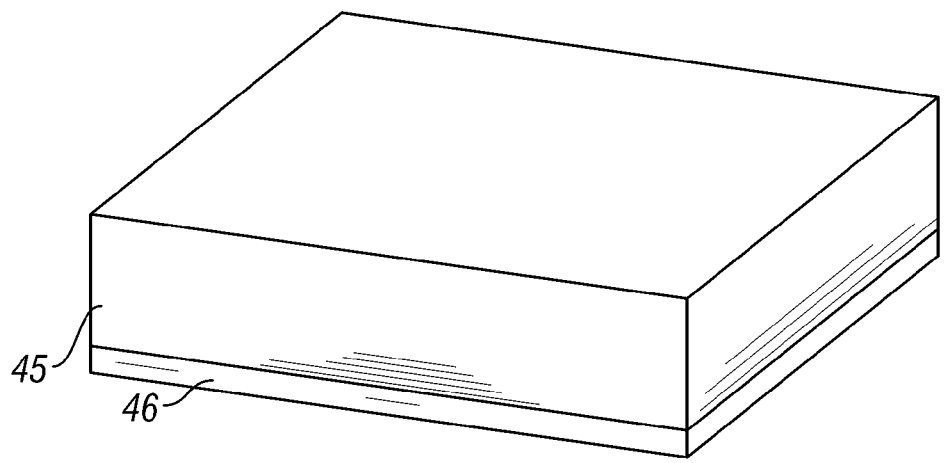
FIG. 2a through FIG. 2d illustrate prior art device fabrication.
Figure 2B:
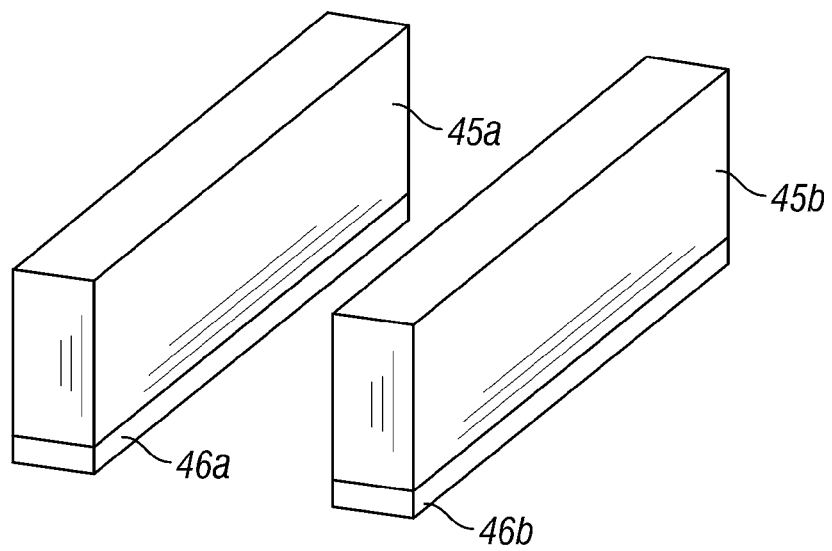
Figure 2C:
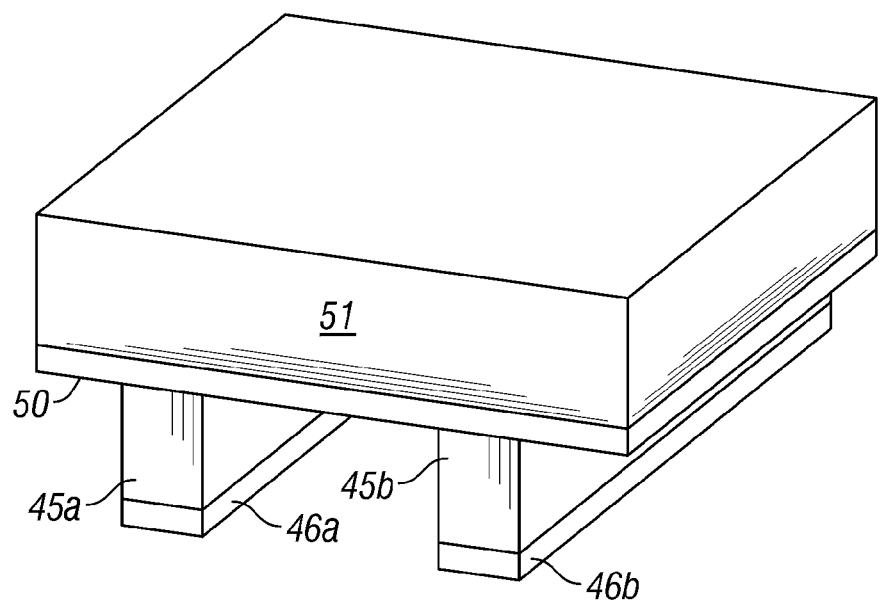
Figure 2D:
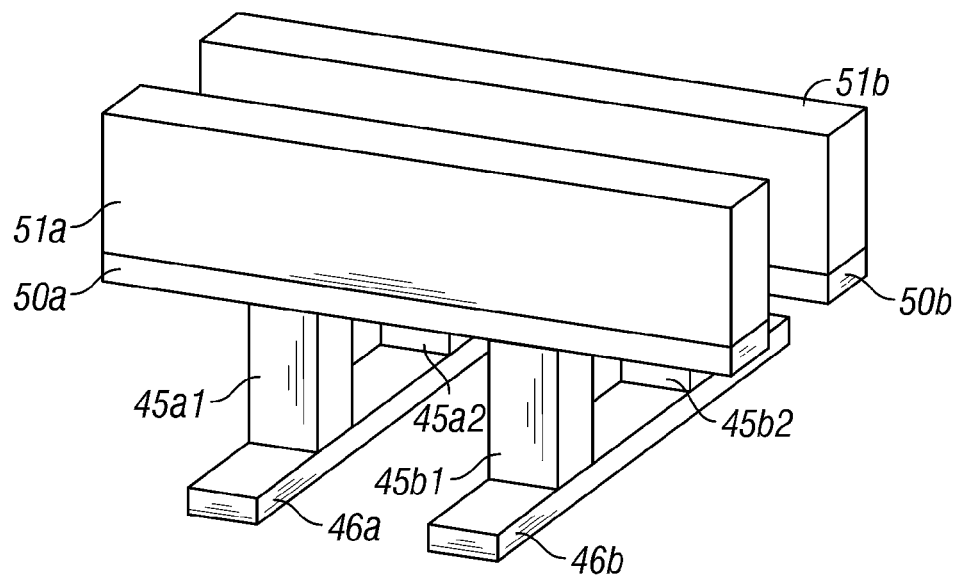

The methods of fabrication described by Johnson et al. to form an array of such memory cells make use of self-alignment. As shown in FIG. 2a, the first conductor material 46 and first semiconductor layer stack 45 are deposited. Both are patterned and etched in a first etch to form substantially parallel first conductors and first etched lines of semiconductor layer stack in a single masking step, the resulting structure shown in 2b. Note that the semiconductor layer stack has been etched at this point into lines 45a and 45b, and not yet into pillars. The gaps between the lines of semiconductor layer stack and the conductors are filled with dielectric material (not shown) to insulate the wiring and devices from one another. Next, in FIG. 2c, the second conductor material 50 and second semiconductor layer stack 51 are deposited, then are patterned and etched in a second etch to form substantially parallel second conductors and second etched lines of semiconductor layer stack which are substantially perpendicular to the first conductors. As shown in FIG. 2d, the second etch continues past the second conductors and etches through the first lines of semiconductor layer stack, forming first semiconductor pillars such as 45a1 and 45b1, leaving the first pillars with substantially rectangular cross-sections. The insulating dielectric is not etched. Because they were formed in a shared masking step, two opposing sides of each of the first pillars (e.g. 45a1) are self-aligned with the edges of the first conductor below (e.g. 46a), while the other two opposing sides of each of the first pillars are self-aligned with the edges of the second conductor above (e.g., 50a.) The gaps in between the second conductors and second lines of semiconductor material are filled with dielectric material.

Use of self-alignment allows for a minimal number of masking steps per device layer. Self alignment eliminates the spatial error that occurs when one layer is independently aligned to the layer below, allowing for smaller feature size. Feature size is the minimum dimension of elements in a cell.

As this process is scaled to still smaller feature size, however, two challenges come to the fore. First, as feature size gets smaller, conductors and pillars get thinner and move closer together, causing the aspect ratio (ratio of height to width) of the gaps between features to increase. When the aspect ratio exceeds about 7:1, it becomes difficult to reliably fill gaps with dielectric material using conventional techniques without creating voids in the fill. These voids can be fatal to device performance.

Figure 3A:
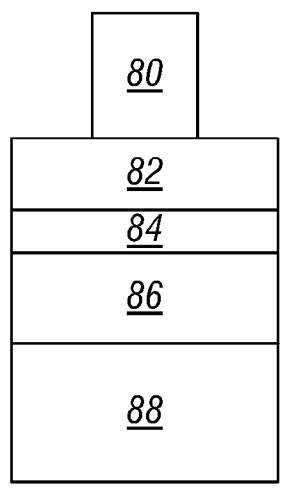
FIG. 3a through FIG. 3c illustrate etch undercut.
Figure 3B:
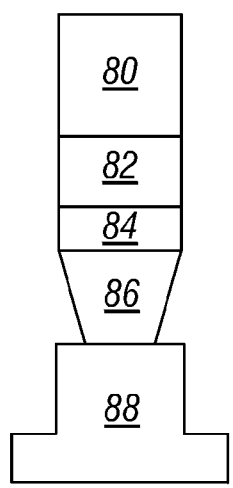

Another problem is that of etch undercut that occurs when etching a film stack consisting of several different materials. FIG. 3a illustrates a stack of materials to be etched. In this example, the stack consists of a layer of polycrystalline silicon 82 (also called polysilicon), TiN layer 84, $TiSi_2$ layer 86, and polysilicon layer 88. Photoresist layer 80 is patterned on top, and all of the layers below are etched. Etch selectivity, which describes the etching rate of one material relative to the etching rate of another material, between polysilicon and $TiSi_2$ is poor, so while polysilicon layer 88 is being etched, $TiSi_2$ layer 86 is unintentionally etched as well, as illustrated in FIG. 3b. That is, as the polysilicon in polysilicon layer 88 underneath the $TiSi_2$ layer 86 is being etched vertically, the $TiSi_2$ of $TiSi_2$ layer 86 is etched laterally.

Figure 3C:
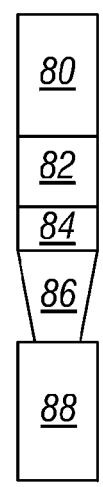

Such undercut can damage device performance. As feature size decreases, the width of the stacks to be etched decreases. The height of the stack is unchanged, however, so the time required for etch and the amount of undercut is also unchanged. The same absolute amount of undercut on a narrower stack results in a larger percentage undercut, as shown in FIG. 3c.

By recognizing the aspect ratio and undercut problems and solving them through process changes and choices of material, the present invention decreases the minimum feature size achievable in a monolithic three dimensional memory. The present invention decreases aspect ratio by using different fabrication methods, and minimizes etch undercut by using different materials.

Figure 2E:
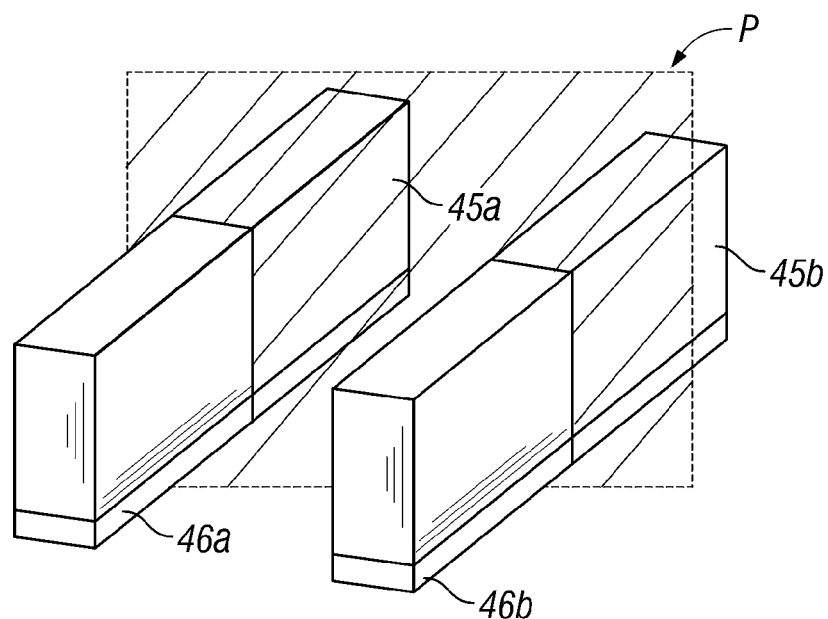
FIG. 2e and FIG. 2f illustrate viewing planes used in FIG. 4a and FIG. 4c.
Figure 4A:
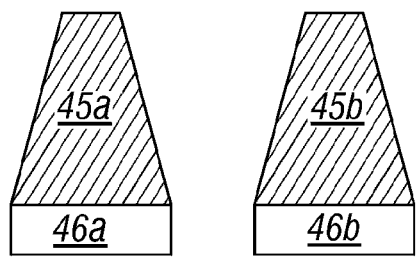
FIG. 4a through FIG. 4c illustrate stringer formation.
Figure 4B:
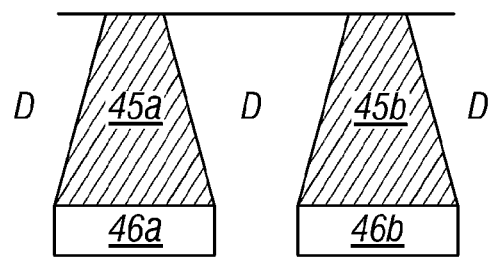

The present invention affords another advantage over prior art methods and structures by preventing a problem that may arise in the fabrication steps described in Johnson et al. Depending on etch conditions, the first etch, which results in the first lines of semiconductor layer stack and the first conductors, shown in FIG. 2b, may not yield perfectly vertical walls. Material higher in the stack is exposed to etchant longer than material lower in the stack, potentially causing sloping sides, as shown in cross-section in FIG. 4a. The cross section is along plane P, shown in FIG. 2e. For clarity, the slope is exaggerated. FIG. 4b shows the same first lines of etched semiconductor layer stack filled with dielectric material D. Next the second conductors are deposited, then the second layer stack, and finally the second etch takes place.

Figure 2F:
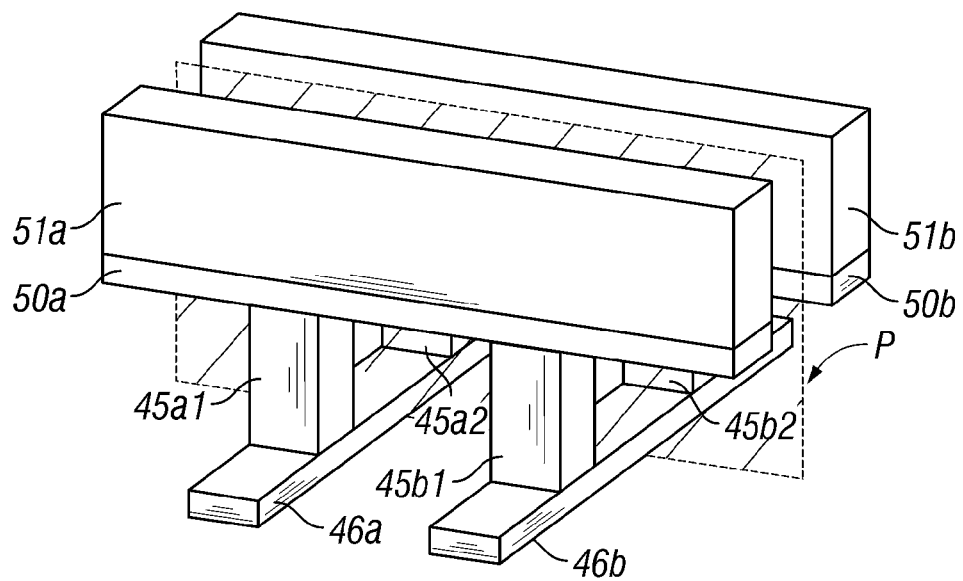
Figure 4C:
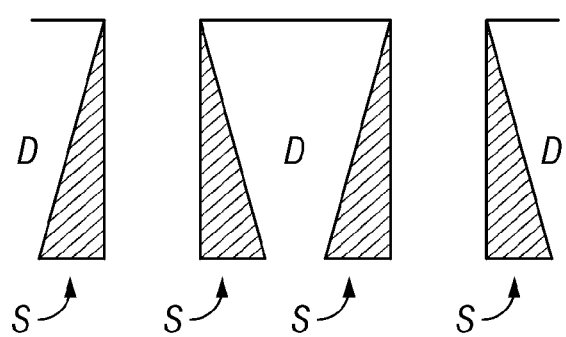

Turning to FIG. 2f, the second etch etches through a second layer of semiconductor layer stack, second conductors, and the first lines of semiconductor layer stack. When etching the first lines of semiconductor layer stack, this etch is selective to material constituting the first and second semiconductor layer stacks, and does not appreciably etch the dielectric material between the first lines of semiconductor layer stack (recall this dielectric material was deposited after the first etch and before deposition of the second conductors.) This second etch slices through spaced segments of first lines of semiconductor layer stack, creating pillars. Material within the first semiconductor layer stack trapped under overhanging dielectric material, between pillars, may not be removed in the second etch, as shown in FIG. 4c. The cross section is again along plane P, shown in FIG. 2f. This remaining material, sometimes called a "stringer," S, can provide an unintended electrical path between adjacent pillars, e.g. between 45a1 and 45a2, and between 45b1 and 45b2 in FIG. 2f.

Where two adjacent pillars have stringers that interfere with their electrical isolation from each other, the functioning of these memory cells can be compromised. Specifically, a write operation to one memory cell can undesirably affect one or both memory cells, i.e., a write disturb condition can occur.

The present invention, by employing an improved method of fabrication, prevents formation of stringers.

Fabrication

The fabrication process of the present invention will be described first in general terms, and then specific embodiments will be described in greater detail.

The process typically begins on an insulating layer formed over a semiconductor substrate. First the conductors are formed. In the first step, a thin adhesion layer, preferably of TiN, can be deposited. Above this a conductor material, preferably tungsten, is deposited. Tungsten has low resistivity, so the conductor layer can be thinner than if other conductor materials, such as $TiSi_2$, were used, helping to decrease aspect ratio. The use of tungsten rather than $TiSi_2$ also lowers the overall thermal budget: $TiSi_2$ is formed by depositing Ti on Si, then annealing the materials to form $TiSi_2$. The temperature at some point of the processing must be at least 750 degrees C. to form the desired low resistivity C54 $TiSi_2$ phase. Tungsten, on the other hand, can be deposited at 400 to 500 degrees C. Reducing processing temperature limits dopant diffusion and minimizes agglomeration of materials like $TiSi_2$ or $CoSi_2$ (which may be used in transistors underneath the memory array.) Dopant diffusion and silicide agglomeration are detrimental to device performance.

Optionally, a barrier material, preferably TiN, can be deposited next. This barrier layer prevents reaction between tungsten and silicon, which in some embodiments will be deposited in a later step. (This TiN barrier layer is preferred but not essential. If included, it can be formed either as the top layer in the conductor or as the bottom layer in the overlying semiconductor element.) Next the deposited layers are patterned and etched to form a plurality of substantially parallel first conductors. The materials etched during this etch step are TiN and tungsten. TiN and tungsten have good etch selectivity, so etching of the TiN adhesion layer does not cause undercut of the tungsten layer. Next the gaps between the conductors are filled with dielectric material, preferably $SiO_2$, and planarized to expose the tops of the conductors, preferably by chemical mechanical polishing (CMP). The relatively short height of the TiN adhesion layer—tungsten conductor—(optional) TiN barrier layer stack allows for relatively small aspect ratio for deposition of the dielectric material in the gaps.

Next the semiconductor elements are formed. If the TiN barrier material was not deposited as part of the conductors, it can be deposited at this point, as part of the materials used to form the semiconductor elements. Above this optional TiN barrier layer, several layers of semiconductor material and an antifuse layer are deposited or grown. Semiconductor material may be doped polysilicon. Different diode-antifuse configurations are possible. Next the deposited semiconductor layer stack is patterned and etched to form pillar-shaped semiconductor elements. In most embodiments, the materials etched are silicon, a very thin layer of $SiO_2$, and a thin layer of TiN. Due to the etch chemistries involved and to the thinness of the $SiO_2$ and TiN layers, little or no undercut occurs. Next the gaps between the semiconductor elements are filled with dielectric material, preferably $SiO_2$, and planarized to expose the tops of the semiconductor elements, preferably by CMP. The height of the gap to be filled with dielectric is only the height of the semiconductor elements, so the aspect ratio remains low.

Next second conductors are formed above the semiconductor elements. As before, an adhesion layer of TiN is deposited, which is followed, preferably, by a layer of tungsten, and, optionally, a barrier layer of TiN. The deposited layers are again patterned and etched into a plurality of substantially parallel second conductors, preferably substantially perpendicular to the first conductors. As before, the gaps between the conductors are filled, preferably with $SiO_2$, and planarized.

The resulting structure is a bottom or first story of memory cells. By continuing to form semiconductor elements and conductors, further memory cells can be built above this first story. The upper conductors of the first story of cells will serve as the lower conductors of an overlying, second story of cells. Ultimately the memory can be several stories high.

Because the gaps between conductors are filled in one deposition step, and the gaps between pillars are filled in another deposition step, the aspect ratio of the gaps to be filled is less than if gaps extending vertically from the top of pillars to the bottom of the conductor below were filled in a single deposition step, as in the self-aligned process. Similarly, the shorter etches mean shorter etch times, minimizing etch undercut. The choice to etch materials with good etch selectivity in a single patterning step for both the conductor etches and for the semiconductor element etches also minimizes etch undercut. "Minimal etch undercut" means less than 200 angstroms of undercut measured perpendicular to an etched wall.

What follows is a more detailed description of the present invention, including a variety of embodiments.

Formation of the memory begins with a substrate. This substrate can be any semiconducting substrate as known in the art, such as single crystal silicon, IV-IV compounds like silicon-germanium or silicon-germanium-carbon, III-V compounds, II-VII compounds, epitaxial layers over such substrates, or any other semiconducting material. The substrate may include integrated circuits fabricated therein.

An insulating layer is formed over the substrate. The insulating layer can be silicon oxide, silicon nitride, high-dielectric film, Si—C—O—H film, or any other suitable insulating material.

The first conductors are formed over the substrate and insulator. An adhesion layer may be included between the substrate and the conducting layer to help the conducting layer adhere. Preferred materials for the adhesion layer are TaN, WN, TiW, sputtered tungsten, TiN, or combinations of these materials. If the overlying conducting layer is tungsten, TiN is preferred as an adhesion layer.

If such an adhesion layer is included, it can be deposited by any process known in the art. Where this adhesion layer is TiN, it can deposited by depositing a TiN material, or by depositing a Ti material and then nitriding the Ti material. The TiN can be deposited by any chemical vapor deposition (CVD) process, physical vapor deposition (PVD) process such as sputtering, or an atomic layer deposition (ALD) process. In one embodiment, the TiN material is deposited by a sputtering process.

The thickness of the adhesion layer can range from about 20 to about 500 angstroms. In one embodiment, the thickness of the adhesion layer is about 200 angstroms. Note that in this discussion, "thickness" will denote vertical thickness, measured in a direction perpendicular to the substrate.

The next layer to be deposited is the conducting layer. If no adhesion layer is provided, the conducting layer is the first layer deposited. This conducting layer can comprise any conducting material known in the art, including tantalum, titanium, tungsten, aluminum, copper, cobalt, or alloys thereof. TiN may be used. Where the conducting layer is tungsten, it can be deposited by any CVD process or a PVD process. In one embodiment, the tungsten is deposited by a CVD process. The thickness of the conducting layer can depend, in part, on the desired sheet resistance and therefore can be any thickness that provides the desired sheet resistance. In one embodiment, the thickness of the conducting layer can range from about 200 to about 2000 angstroms. In another embodiment, the thickness of the conducting layer is about 1500 angstroms.

If tungsten is used for the conducting layer, it is preferred to use a barrier layer between the tungsten and the semiconductor material that will be part of the semiconductor elements that will eventually overlie the conductors. Such a barrier layer serves to prevent reaction between tungsten and silicon. The barrier layer may either be the top layer of the conductors or the bottom layer of the semiconductor elements.

If a barrier layer is to be used, and is to be formed as the top layer of the conductors, the barrier layer should be deposited after the conducting layer. Any material serving this function can be used in the barrier layer, including WN, TaN, TiN, or combinations of these materials. In a preferred embodiment, TiN is used as the barrier layer. Where the barrier layer is TiN, it can be deposited in the same manner as the adhesion layer described earlier.

The thickness of the barrier layer in the finished device can be any thickness that will provide the function noted above, for example a thickness of about 20 to about 500 angstroms. The final thickness of the barrier layer is preferably about 200 angstroms. Note that planarization of this layer will remove some material, so sacrificial material should be deposited in anticipation of this. If there is no barrier layer on top, some tungsten will be lost through CMP. However the CMP selectivity is significant between $SiO_2$ and tungsten, e.g., the rate at which oxide is polished is higher than the rate at which tungsten is polished. Thus $SiO_2$ can be removed from the top of the tungsten with confidence that all of the $SiO_2$ can be removed while removing a minimal amount of tungsten.

The material used in the conducting layer and the material used in the adhesion and barrier layers, if present, should be chosen to have good etch selectivity.

Once all the layers that will form the conductors have been deposited, the layers will be patterned and etched using any suitable masking and etching process to form substantially parallel conductors. In one embodiment, a photoresist mask is deposited, patterned by photolithography and the layers etched, and then the mask is removed, using standard process techniques such as "asking" in an oxygen-containing plasma, and strip of remaining polymers formed during etch in a liquid solvent such as EKC.

The width of the conductors after etch can range from about 300 to about 2500 angstroms. (In this discussion "width" will refer to the width of a line or feature measured in the plane substantially parallel to the substrate.) The width of the gaps between the conductors preferably is substantially the same as the width of the conductors themselves, though it may be greater or less. In one embodiment, the width of the conductors is about 1500 angstroms, as is the width of the intervening gaps. As noted earlier, it becomes difficult to reliably fill gaps with dielectric material like $SiO_2$ when the aspect ratio of the gaps is greater than 7:1. Thus the width of the gaps should be chosen such that the aspect ratio of the gaps is not greater than 7:1, and is preferably much smaller. Clearly the width can be reduced when the thicknesses of the layers comprising the conductors, and thus of the conductors themselves, are smaller.

It should be noted that this 7:1 limit for aspect ratio applies when $SiO_2$ is used as the dielectric fill material. Alternative fill materials, like silicon nitride, can in fact be used for reliable fill without voids to fill gaps with a higher aspect ratio. $SiO_2$ is preferred for several reasons, including ease of processing, low thermal budget, and low leakage as compared to silicon nitride and other dielectrics.

The width of the conductors and gap is also restricted by the selected pitch. Pitch is the distance from one feature to the next occurrence of the same feature: from the center of one conductor to the center of the adjacent conductor, for example, or from the center of one semiconductor element to the center of an adjacent semiconductor element. Semiconductor elements are to be formed above the conductors, as will be described in detail below. Each semiconductor element will be formed directly over a conductor, so the semiconductor elements and the conductors preferably should have the same width and the same pitch. The pitch of the conductors is limited not only by the need to achieve an aspect ratio no more than 7:1 for gaps between the conductors, but also to achieve the same 7:1 aspect ratio, or less, for gaps between the yet-to-be-formed overlying semiconductor elements.

Next a dielectric material is deposited over and between the conductors. The dielectric material can be any known electrically insulating material, such as silicon oxide, silicon nitride, or silicon oxynitride. In a preferred embodiment, silicon oxide is used as the insulating material. The silicon oxide can be deposited using any known process, such as CVD, or, for example, high density plasma CVD (HD-PCVD).

Finally removal of the $SiO_2$ on top of the conductors while leaving the $SiO_2$ in between the conductors, a process known as planarization, is performed. This planarization can be performed by any process known in the art, such as CMP.

Alternatively, the conductors can be formed by a Damascene process, in which oxide is blanket deposited, lines are etched in the oxide, and then the lines are filled with TiN and tungsten to create the conductors. The TiN and tungsten films on top of the original plane of oxide are removed by any process known in the art, such as CMP, leaving TiN and tungsten wires, with dielectric material insulating the wires from one another.

Next, semiconductor elements will be formed above the completed conductors. In general, a semiconductor element comprises two portions of a diode and an antifuse. (Optionally, a barrier layer may be included.) Several embodiments are possible. The two portions of a diode may be separated by an antifuse, forming an incipient diode that only becomes a diode when the antifuse is ruptured. Alternately, the semiconductor element may comprise an intact diode with an antifuse above and in series with it. In an alternate embodiment, a semiconductor element may comprise an intact diode formed with an antifuse formed below and in series with it. Any of these embodiments may optionally include a barrier layer as the bottom layer in the semiconductor element.

In all of these embodiments, if a barrier layer is to be used between the lower conductors and the semiconductor elements, and is to be the bottom layer of the semiconductor element rather than the top layer of the conductors, it will be deposited as the first layer after planarization of the conductors. It can be of any of the materials and deposited in any of the manners described earlier. Its thickness, as when it is deposited as part of the conductors, can be, for example, about 20 to about 500 angstroms. The thickness of the barrier layer is preferably about 200 angstroms.

Subsequent processing depends on which configuration of diode halves and antifuse is employed.

Junction Antifuse

In one group of embodiments, the antifuse is formed between two halves of an incipient diode, which becomes a diode only when the antifuse is ruptured. This configuration will be referred to as a junction antifuse. There are four most preferred embodiments of junction antifuse-type semiconductor elements. Two are incipient P+/N− diodes (in which, for example, heavily doped P-type silicon is on one side of the antifuse and lightly doped N-type silicon is on the other), while two are incipient N+/P− diodes (in which heavily doped N-type silicon is on one side of the antifuse and lightly doped P-type silicon is on the other.) Each of these diode types can be formed "rightside-up" or "upside-down". "Rightside up" diodes will describe diodes in which the P+ or N+ portion is deposited first, forming the bottom portion of the diode, followed by the N− or P− portion, forming the top of the diode. "Upside down" diodes describes diodes in which the N− or P− portion is deposited first, forming the bottom portion of the diode, followed by the P+ or N+ portion, forming the top of the diode.

The semiconductor material can be silicon, silicon-germanium, silicon-germanium-carbon, germanium, or other suitable IV-IV compounds, gallium arsenide, indium phosphide, or other suitable III-V compounds, zinc selinide, or other II-VII compounds, or a combination. Silicon is the material used most commonly in the industry, so, for simplicity, this description will refer to the semiconductor material as silicon, but it will be understood that other materials may be substituted. In preferred embodiments, polysilicon is used. Silicon layers may be deposited amorphous, then later crystallized by heat treatment, or may be deposited as polysilicon.

To form a rightside-up P+/N− diode with junction antifuse, a layer of heavily doped P-type silicon must be formed. This layer can be formed by any deposition and doping method known in the art. The silicon can be deposited and then doped, but is preferably doped in situ. In a preferred embodiment, this layer can range from about 100 to about 1000 angstroms, preferably 200 angstroms, and have a dopant concentration of about $1\times10^{19}$ to about $3\times10^{21}$ atoms/cm$^3$, and preferably about $1\times10^{21}$ atoms/cm$^3$.

The antifuse can be a thin layer of $SiO_2$. The $SiO_2$ can be made by oxidizing the underlying silicon layer, or silicon oxide material can be deposited, typically using a CVD process. In one embodiment, the silicon oxide layer is grown by oxidizing the underlying silicon in $O_2$ plus $N_2$ at a temperature of about 650 degrees C. for about 60 seconds. The thickness of the $SiO_2$ layer can range from about 10 to about 100 angstroms, and in one embodiment is about 25 angstroms.

Above the antifuse is lightly doped N-type silicon. This layer can be formed by any deposition and doping method known in the art. The thickness of the lightly doped N-type silicon layer can range from about 1000 to about 4000 angstroms, preferably about 2500 angstroms, and have a dopant concentration of about $1 \times 10^{15}$ to about $1 \times 10^{18}$ atoms/cm$^3$, and preferably $1 \times 10^{16}$ atoms/cm$^3$. In one embodiment, silicon is deposited without intentional doping, yet has defects which render it slightly N-type.

Above this is a layer of heavily doped N-type silicon. This layer forms the ohmic contact to the top portion of the P+/N− diode. This layer can be formed by any deposition and doping method known in the art. The thickness of the heavily doped N-type silicon can range from about 100 to about 2000 angstroms, preferably about 1000 angstroms. Note this is the thickness as-deposited. If this layer is subject to later planarization, as in most embodiments, it will be thinner in the finished device. This layer has a dopant concentration of about $1 \times 10^{19}$ to about $1 \times 10^{21}$ atoms/cm$^3$, preferably $5 \times 10^{20}$ atoms/cm$^3$.

Using conventional equipment and techniques, when doped silicon is deposited in a furnace, doped silicon is deposited not only on the wafer surfaces, but also on every other surface in the furnace. If the next deposition in the same furnace is of undoped silicon, or silicon of the opposite conductivity type, outgassing of the dopant from silicon deposited in the previous deposition can compromise doping quality. This is known variously as autodoping or the memory effect. To prevent this, the semiconductor element can be "capped" by an undoped layer of silicon deposited to a thickness of at least about 200 angstroms. This undoped layer of silicon covers and seals the previously deposited doped silicon coating surfaces in the furnace, protecting the next deposited layer from outgassed dopant. This technique is described in Herner, U.S. patent application Ser. No. 09/859,282, filed May 17, 2001, and hereby incorporated by reference. The undoped "cap" will be removed by a subsequent planarization step and therefore will not become part of the finished device. This technique can be used at any point when sequential depositions of different conductivity types are to be performed in the same furnace, and when future processing will remove the undoped cap.

For an upside-down P+/N− diode with a junction antifuse, the same layers are formed with the same dimensions and in same way, but in a different order: first the heavily doped N-type silicon layer, which forms the ohmic contact to the diode then the lightly doped N-type silicon layer, then the antifuse, then the heavily doped P-type silicon layer.

The rightside-up and upside-down N+/P− diodes with junction antifuse use the same layers as the P+/N− diodes, though with the conductivity type of each doped silicon layer reversed: A rightside-up N+/P− diode, from the bottom up, includes heavily doped N-type silicon, an antifuse, lightly doped P-type silicon, and heavily doped P-type silicon. The heavily doped P-type silicon forms the ohmic contact to the top portion of the diode. An upside-down N+/P− diode, from the bottom up, includes heavily doped P-type silicon, which forms the ohmic contact to the bottom of the diode, lightly doped P-type silicon, an antifuse, and heavily doped N-type silicon. The deposition and doping methods are as known in the fields, and the thicknesses of the layers are as described above for the corresponding layer with conductivity types reversed.

Top Antifuse

In another group of semiconductor element embodiments, the antifuse is formed on top of a diode. This configuration will be referred to as a top antifuse. As with the junction antifuse group of embodiments, the diode can be either a P+/N− or an N+/P− diode, and can be built rightside-up or upside-down. For preferred top antifuse embodiments, the antifuse is grown after the diode has been etched, filled, and planarized.

A top antifuse-type rightside-up P+/N− diode will comprise, from the bottom up, the following layers: heavily doped P-type silicon, lightly doped N-type silicon, heavily doped N-type silicon (which forms the ohmic contact to the top of the P+/N− diode), and an antifuse. The same diode, upside down, will comprise, from the bottom up: heavily doped N-type silicon, which forms the ohmic contact to the bottom of the P+/N− diode, lightly doped N-type silicon, heavily doped P-type silicon, and an antifuse.

A top antifuse-type rightside-up N+/P− diode will comprise, from the bottom up: heavily doped N-type silicon, lightly doped P-type silicon, heavily doped P-type silicon, which forms the ohmic contact to the top of the diode, and an antifuse. The same diode, upside-down, will comprise, from the bottom up: heavily doped P-type silicon, which forms the ohmic contact to the bottom of the diode, lightly doped P-type silicon, heavily doped N-type silicon, and an antifuse.

In the junction antifuse embodiments above and the bottom antifuse embodiments described below, all of these layers are deposited (or grown), then patterned and etched, the gaps filled with dielectric, and semiconductor elements and intervening dielectric fill planarized. Most top antifuse embodiments deviate from that pattern for the formation of the antifuse.

A very thin antifuse layer formed on top of the semiconductor element would be highly vulnerable to inadvertent damage or removal if subjected to planarization. For preferred top antifuse embodiments, the antifuse is formed after planarization. The doped silicon layers are deposited and doped using any process known in the art (using the undoped cap if desired), then patterned, etched, filled, and planarized to expose heavily doped silicon at the top of the semiconductor element. After planarization is complete, the exposed silicon is oxidized and a SiO$_2$ antifuse grown on top of it.

An advantage of the top antifuse embodiments is reduced processing time. In the junction antifuse embodiments, to deposit the layers that will form the diode portions and the antifuse, first silicon is deposited, then the antifuse is formed, either through deposition of SiO$_2$ or by oxidation of the top of the underlying silicon, and then more silicon is deposited. After the first deposition of silicon, the wafers must be unloaded and moved to another tool (for rapid thermal anneal, for example), to grow the antifuse. Then the wafers must be moved back to the furnace for the next silicon deposition. In the top antifuse embodiments, on the other hand, only a single deposition of silicon is required, reducing processing time and cost, and reducing exposure to contaminants cause by extra handling.

Bottom Antifuse

In another group of embodiments, the diode is formed above the antifuse. This configuration will be referred to as a bottom antifuse. As with the junction antifuse group of embodiments, the diode can be either a P+/N− or an N+/P− diode, and can be built rightside-up or upside-down. Deposition of the silicon layers, and their dopant levels and thicknesses, can be as described in the top antifuse embodiments.

If a barrier layer of TiN is used, either as the top layer of the conductor or as the bottom layer of the semiconductor element, these bottom antifuse embodiments present some challenges. If SiO$_2$ is used as the antifuse, a SiO$_2$ layer directly on top of TiN cannot be grown through oxidation, as it can when being formed on top of silicon. Instead it is deposited directly as SiO$_2$. It is difficult to deposit a thin stoichiometric layer of SiO$_2$ on top of TiN. These embodiments are thus less preferred. Clearly, other dielectric materials could be used instead.

Pattern, Etch, Fill, and Planarize

When the layers that will form the optional bottom barrier layer, the diode portions and the antifuse are deposited (omitting the antifuse, which will be grown later, in the top antifuse embodiments), the layers should be patterned and etched to form semiconductor elements. The semiconductor elements should have the same pitch and the same width as the conductors below, such that each semiconductor element is formed on top of a conductor.

With perfect alignment, the center of a semiconductor element should be located directly over the center of the conductor below it, as in FIG. 5a. A significant amount of misalignment can be tolerated, however, as in FIG. 5b. As long as a semiconductor element isn't 100 percent misaligned, bridging adjacent conductors and forming an electrical contact with both of them, as in FIG. 5c, the resulting device can function successfully with substantial misalignment. The bulk of the resistance in the circuit described, namely a programmed diode/antifuse in contact with conductors, should come from the diode, which has a resistivity in the thousands of ohms due to the use of lightly doped silicon. In contrast the contact resistance between the tungsten/TiN wire and heavily doped silicon is less than 100 ohms. Therefore, even if misalignment between the wiring and semiconductor element results in only 10 percent of the semiconductor area being in contact with the wiring either above or below, the resistance will not be substantially different than perfectly aligned layers in which 100 percent of the cross section of the semiconductor element is in contact with the wiring.

Referring to FIG. 6a, underlying conductors C1 extend in a first direction D1. If underlying conductors C1 and overlying semiconductor elements S1 are to align, then clearly the pitch P1 of the semiconductor elements S1 in a second direction D2 (preferably substantially perpendicular to the first direction D1) must be the same as the pitch P1 of the underlying conductors C1. The pitch P2 of the semiconductor elements S1 in the first direction D1, however, is not constrained by the pitch P1 of the underlying conductors C1.

Figure 6B:
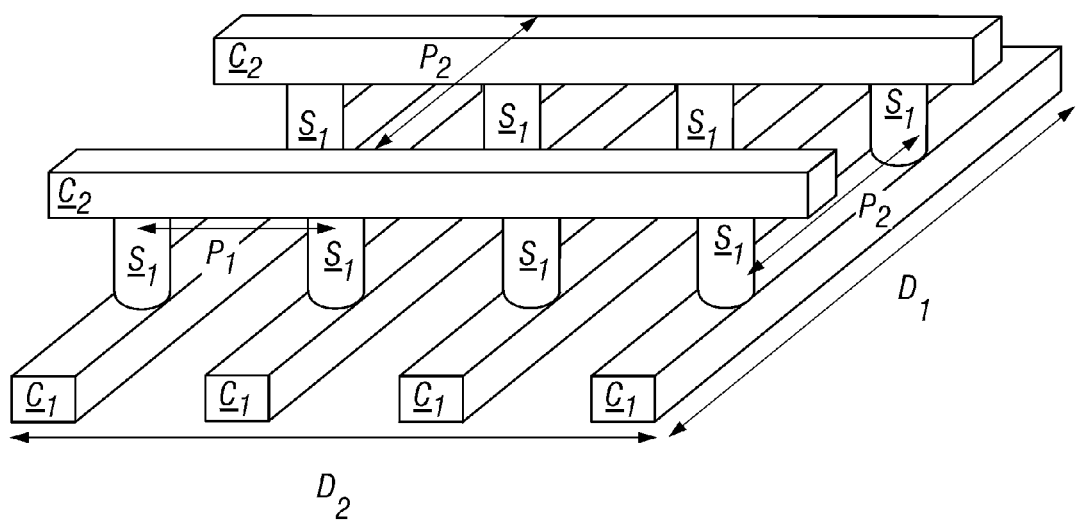

Later in the process, as shown in FIG. 6B, overlying conductors C2 will be formed over the semiconductor elements. Overlying conductors C2 extend in the second direction, D2. The pitch P2 of the semiconductor elements S1 in the first direction D1 should be chosen to align with the overlying conductors to be formed above, and thus should be at a pitch P2 allowing alignment with their intended pitch P2 and orientation. As with the underlying conductors, substantial misalignment between the semiconductor elements and the overlying conductors can be tolerated.

The semiconductor elements can be formed using any suitable masking and etching process. For example, a photoresist mask can be deposited, patterned using photolithography and etched, and then the photolithography mask removed. Alternately, a hard mask of some other material, for example $SiO_2$, can be formed on top of the semiconductor layer stack, with bottom antireflective coating (BARC) on top, then patterned and etched. Similarly, dielectric antireflective coating (DARC) can be used as a hard mask. The resulting structure at this stage of the process is shown in FIG. 6A.

For reasons explained more fully below, rectangular features formed with feature size in both dimensions less than about 2500 angstroms using standard photomasking techniques tend to be substantially cylindrical, regardless of the shape of the mask. The semiconductor elements after etch thus will be substantially cylindrical, with a diameter ranging from about 300 to about 2500 angstroms. The width of the gaps between the semiconductor elements preferably is substantially the same as the diameter of the semiconductor elements themselves, though it may be greater or less. In one embodiment, the diameter of the semiconductor elements is about 1500 angstroms, as is the width of the intervening gaps at their narrowest point.

As noted earlier, it becomes difficult to fill gaps with dielectric material such as $SiO_2$ when the aspect ratio of the gaps is greater than 7:1. Thus the width of the gaps should be chosen such that the aspect ratio of the gaps is not greater than 7:1. Clearly the width can be reduced when the thicknesses of the layers comprising the semiconductor elements, and thus of the semiconductor elements themselves, are smaller.

Next a dielectric material is deposited over and in between the semiconductor elements, filling the gaps between them. The dielectric material can be any known electrically insulating material, such as silicon oxide, silicon nitride, or silicon oxynitride. In a preferred embodiment, $SiO_2$ is used as the insulating material. The $SiO_2$ can be deposited using any known process, such as CVD, or, for example, HDPCVD.

Planarization is then performed to remove the dielectric material on top of the semiconductor elements and expose their top surfaces, while leaving the dielectric in between them. This planarization can be performed by any process known in the art, such as CMP. In preferred top antifuse embodiments, a $SiO_2$ antifuse layer is then grown on top of the exposed silicon after CMP.

Overlying conductors can be formed in the same manner as the underlying conductors. The resulting structure is a bottom or first story of memory cells. By continuing to form semiconductor elements and conductors, further memory cells can be built above this first story. The upper conductors of the lower story of cells will serve as the lower conductors of an overlying, second story of cells. Ultimately the memory can be several stories high. In a preferred embodiment, the memory can contain from two to twelve stories. In another preferred embodiment, the memory contains eight stories.

One advantage afforded by the current invention is that in all embodiments the top layer of the semiconductor element when planarization is performed on it (and on the intervening dielectric fill) is a heavily doped layer. CMP (or another planarizing method) will reduce the thickness of the layer on which it is performed. This reduction in thickness can be difficult to control, and may vary across a wafer. The thickness of the lightly doped layer in a diode is critical to diode properties like leakage and reverse stress failure. It is desirable for all devices to have the same, or very nearly the same thickness of the lightly doped layer. Performing planarization on this layer, which results in a thickness that can vary greatly not only from wafer-to-wafer, but also within the wafer, makes for a less robust process. The thickness of the heavily doped layers, on the other hand, is much less crucial to device performance. Their thickness can vary to a much larger degree while not affecting the device performance greatly. Planarizing on these layers is far less likely to compromise device reliability.

Density

The feature size of the three dimensional memory cell of the present invention, and thus the density of an array composed of such cells, is limited by the thickness (height) of the conductors and of the semiconductor elements. Because of the 7:1 aspect ratio limit for reliable $SiO_2$ gap fill, the gap between features can be no smaller than one-seventh of the height of the features. The semiconductor elements are generally thicker than the conductors, and thus it is their thickness that limits the feature size of the memory cell. Recall the semiconductor element material is deposited, then patterned, etched, and the gaps between the elements filled with dielectric material. Thus, the aspect ratio immediately before dielectric fill is the relevant measure of aspect ratio. After dielectric gap fill, planarizing will remove some semiconductor material at the top of the semiconductor element, in addition to the dielectric. The height of the semiconductor element in the finished device, then, is less than its deposited height.

The height of the semiconductor element is the combined height of the barrier layer (if present), the semiconductor layers, and the antifuse. In the junction antifuse rightside-up P+/N− diode embodiment with a TiN barrier layer, for example, in one preferred embodiment, the heights of these layers are: 200 angstroms (TiN), 200 angstroms (heavily doped P-type silicon), 25 angstroms (antifuse), 2900 angstroms (lightly-doped N-type silicon), and 1000 angstroms (heavily doped N-type silicon and undoped cap.) The total of these thicknesses, the height of the semiconductor element at the time of gap fill, is 4325 angstroms. At a 7:1 aspect ratio, the size of the gap between the semiconductor elements can be about 600 angstroms.

If the smallest preferred thickness for each layer is used instead, those values are 20 angstroms (TiN), 200 angstroms (heavily doped P-type silicon), 10 angstroms (antifuse), 1000 angstroms (lightly-doped N-type silicon), and 1000 angstroms (heavily doped N-type silicon and undoped cap.) The total is 2230 angstroms, which, at 7:1 aspect ratio, allows for a feature size of about 300 angstroms.

Larger thicknesses can also be used: 500 angstroms (TiN), 1000 angstroms (heavily doped P-type silicon), 100 angstroms (antifuse), 4000 angstroms (lightly-doped N-type silicon), and 2000 angstroms (heavily doped N-type silicon and undoped cap.) Using these thicknesses, the total height is 7600, for a feature size of about 1100 angstroms. Clearly, still larger thicknesses and feature sizes are possible as well.

Decreasing feature size allows for a substantial reduction in area density; i.e., memory cells formed on or over an area of substrate. For example, in memory devices like those described in Johnson et al., the area of a memory cell can be represented as $4F^2$, where F is the feature size. Because stories of memory are stacked vertically, the area density of memory devices (cells per area) is $n/(4F^2)$, where n is the number of memory stories. At a feature size of 0.03 micron, with twelve memory stories, then, an area density of $3.3 \times 10^9$ cells/mm$^2$ can be achieved. At a feature size of 0.06 micron, with eight memory stories, an area density of $5.6 \times 10^8$ cells/mm$^2$ can be achieved. At a feature size of 0.14 micron, with eight memory stories, an area density of $1.0 \times 10^8$ cells/mm$^2$ can be achieved. At a feature size of 0.14 micron, with four memory stories, an area density of $5.0 \times 10^7$ cells/mm$^2$ can be achieved.

It is also useful to consider cubic density of memory, or memory cells per volume. In the present invention, the volume of a cell is $z4F^2$, where z is height of the memory cell, assuming (for simplicity) that no insulation is needed between layers. Inverting this value ($1/(z4F^2)$) yields the cubic density.

The final height of the semiconductor element and barrier layer can be about 1430 angstroms or greater and the height of the conductor can be about 220 angstroms or greater. Recall that the height of the semiconductor element in a finished device is less than its as-deposited height, since material is removed by planarization. A semiconductor element and barrier layer with an as-deposited height of 2230 angstroms, after deposition of fill material between semiconductor elements, will be planarized, which can reduce its completed height to, for example, about 1430 angstroms.

The height of any individual cell with these dimensions, then, can be about 1430+220=1650 angstroms or greater.

Thus, with the 0.165 micron height of a memory cell and a feature size of 0.03 micron the cubic density of these devices can be calculated to be about $1.7 \times 10^{12}$ devices (or bits)/mm$^3$.

A semiconductor element and barrier layer with an as-deposited height of about 0.43 micron, could, after planarizing, have a finished height of, for example, 0.35 micron. The conductor thickness could be, for example, 0.15 micron, yielding a cell height of about 0.50 micron. With a feature size of 0.06 micron (achievable with an as-deposited height of 0.43 micron, as described above), a cubic density can be calculated at about $1.4 \times 10^{11}$ cells/mm$^3$.

A semiconductor element and barrier layer with an as-deposited height of about 0.76 micron, could, after planarizing, have a finished height of, for example, 0.68 micron. The finished conductor thickness could be, for example, 0.18 micron, yielding a cell height of about 0.86 micron. With a feature size of 0.11 micron (achievable with an as-deposited height of 0.76 micron), a cubic density can be calculated at about $2.4 \times 10^{10}$ cells/mm$^3$. These area and cubic densities represent a significant improvement over other three dimensional memories.

It has been noted that the semiconductor elements will have a substantially cylindrical shape. As feature size decreases in semiconductor processing, current photolithography techniques tend to round any sharp corners on features. It is believed that this rounding occurs because photons used in the process diffract around the features in the plate used for patterning, resulting in rounded features being printed in the photoresist mask. Thus, the semiconductor element that is etched with this photoresist mask with rounded features will typically have no sharp corners.

Figure 7:
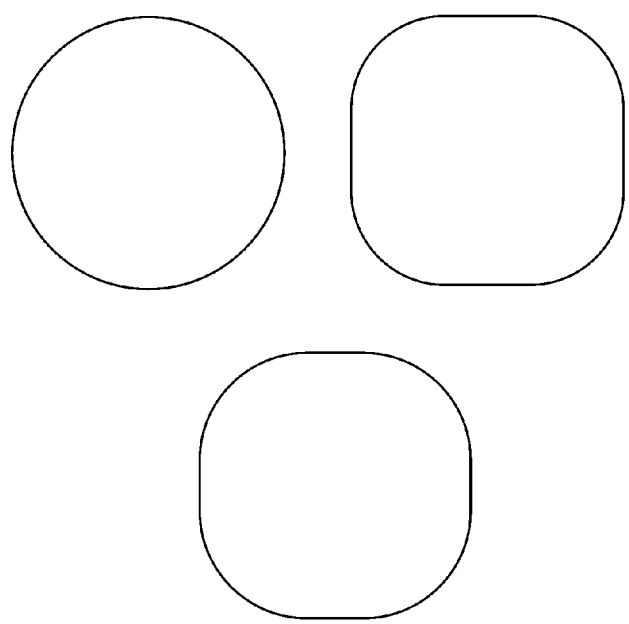
FIG. 7 illustrates cross-sections of example shapes having substantially cylindrical shape.

A "substantially cylindrical" element is one with a cross section which is roughly circular; more specifically, a cross section in which no portion of the perimeter is a straight edge for a length longer than fifty percent of the longest dimension measured through the centroid of the cross-sectional area. Clearly, a straight edge will not be "straight" to a molecular level, and may have minute irregularities; what is relevant is the degree of rounding. Examples appear in FIG. 7.

The substantially cylindrical shape provides one advantage to the memory devices: reduced current leakage. Semiconductor elements having sharp corners often have current leakage at the corners. The current leakage is also proportional to the cross-sectional area of the semiconductor element, so a substantially cylindrical shape provides the smallest area for a given feature size.

It will be apparent to one skilled in the art, however, that the substantially cylindrical shape of the semiconductor elements is an incidental result of using conventional photolithographic techniques to produce very small features, and, while advantageous, some aspects of the invention could be practiced with semiconductor elements of a different shape.

Contact Formation

In monolithic three dimensional memories of the type created according to the present invention, vertical interconnects, termed zias (analogous to vias in conventional two dimensional memories), may be used to connect different stories of memory. Specifically, zias are electrically coupled to active devices on different stories. An "active device" is any device that has asymmetric current versus voltage characteristics. Examples of active devices include diodes and transistors. An active device is contrasted with a passive device, which does not control voltage or current. Examples of passive devices include resistors, capacitors, and inductors. The memory cells of the present invention include diodes, and thus are active devices.

Prior art zia formation in monolithic three dimensional memories is described in Cleeves et al., U.S. patent application Ser. No. 09/746,341, filed Dec. 22, 2000, and hereby incorporated by reference. The materials and methods used by the present invention, particularly of the conductors, simplify formation of zias.

Zia formation according to the present invention takes two primary forms, one for junction antifuse and bottom antifuse embodiments, and another for top antifuse embodiments. Each will be described in turn.

Junction and Bottom Antifuse Zias

Figure 8:
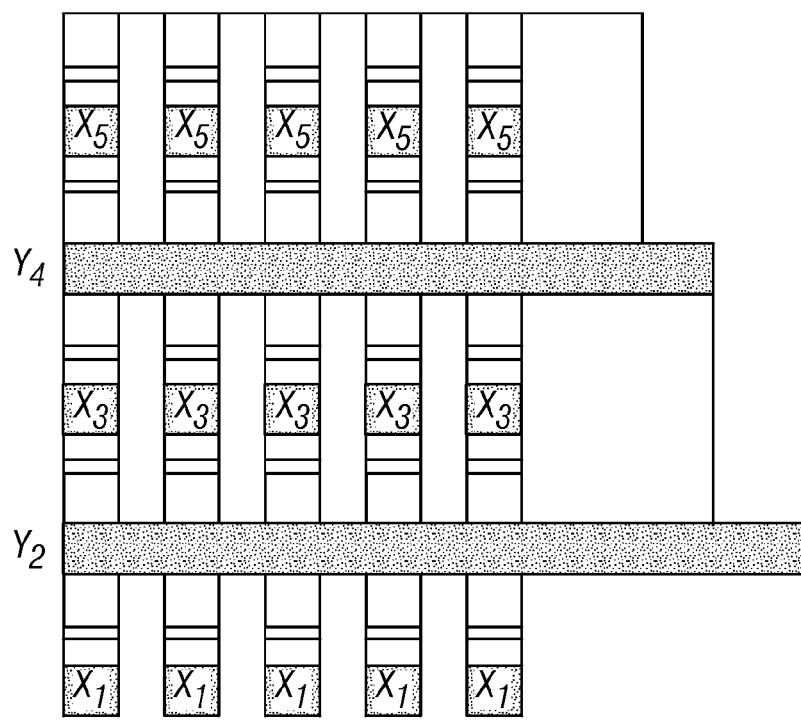
FIG. 8 and FIG. 9 illustrate contact formation according to the present invention.

Turning to FIG. 8, the illustration shows an array of conductors and semiconductor elements. The bottom conductors, extending in the X-direction (in this illustration coming out of the page) are labeled $X_1$, the ones above, extending in the Y direction, are $Y_2$, the ones above, extending in the X direction, are $X_3$, etc. As has been described, there are semiconductor elements sandwiched between each set of conductors. The array is shown when the $Y_6$ conductors, along with zias connecting them to the $Y_4$ and $Y_2$ conductors, are about to be formed.

Note that as in Cleeves et al., in this drawing the lengths of the $Y_2$ and $Y_4$ conductors are staggered to create "landing pads" that are accessible from upper memory layers.

To form zias for junction antifuse and bottom antifuse embodiments, first a pattern and etch is done to remove the dielectric material between the conductors where the zia is to formed, which may be any insulating material, preferably $SiO_2$. This etch forms a contact void, a hole where the zia is to be formed. In the preferred embodiment illustrated here, the conducting layers are tungsten, and a TiN barrier layer between the tungsten of each conductor and the semiconducting material of its overlying semiconductor element is formed as the bottom layer of the semiconductor element. The top of each conductor, then, is of tungsten. (It will be understood that other embodiments using other materials can be employed. This preferred embodiment is selected to simplify explanation.)

There are chemistries which produce high etch selectivities between $SiO_2$ and tungsten and between $SiO_2$ and TiN, allowing all the unwanted $SiO_2$ to be successfully etched without substantial etch damage to the exposed conductors $Y_2$ and $Y_4$.

Next the TiN adhesion layer that normally forms the bottom of the $Y_6$ conductors being formed is deposited, simultaneously creating the adhesion layer for the $Y_6$ conductors and lining the etched contact void. The TiN can be deposited by a method that creates a substantially conformal film, such as CVD. Alternatively, a method such as ionized metal plasma PVD (IMP-PVD) which preferentially deposits TiN on horizontal features, such as landing pads, can be used. Finally the tungsten conducting layer is deposited, completing deposition of the conducting layer for the $Y_6$ conductors and filling the zia. One sidewall of the zia has a stair-step profile. No special deposition steps or materials are required to form the zia; its layers are formed at the same time, by the same depositions, as are the layers that will become the $Y_6$ conductors. For two structures to be formed "by the same deposition" means in the same deposition chamber, of the same deposited material, without stopping and restarting the deposition process. The TiN in the contact and in the $Y_6$ conductors is formed by the same deposition. Similarly, the tungsten in the contact and in the $Y_6$ conductors is formed by the same deposition. The low resistivity of tungsten means zias can be long and retain good conductivity. The $Y_6$ conductors are then patterned, etched, filled, and planarized as usual.

Top Antifuse Zias

A different process can advantageously be used to create zias for top antifuse embodiments. The zia formation process just described for junction and bottom antifuse embodiments started with a pattern and etch step to etch the $SiO_2$ where the zia is to be formed, creating the contact void. This pattern and etch step could involve, for example, patterning photoresist on top of the areas not be etched, etching, then removing photoresist. If such a process were performed in top antifuse embodiments, however, the process of applying and removing photoresist could damage the antifuse immediately beneath it. Damage to the antifuse will adversely affect function of the memory cell.

The antifuse in this context is a critical film, where "critical film" describes a layer whose quality and thickness has a critical influence on device performance.

Zia formation for top antifuse embodiments will be described starting at the point illustrated in FIG. 8, when the $Y_6$ conductors, along with zias connecting them to the $Y_4$ and $Y_2$ conductors, are about to be formed.

To avoid damage to the fragile antifuse that could be caused by removing photoresist, a hard mask of TiN is deposited instead. This TiN layer can be deposited by any method that will not harm the antifuse beneath it (non-biased PVD, for example) and can be from 100 to 1000 angstroms thick, preferably 300 angstroms thick. This TiN layer will become the first part of the adhesion layer at the bottom of the $Y_6$ conductor, still to be formed.

In this embodiment, the TiN at the bottom of a conductor, in addition to acting as an adhesion layer, also acts as an electrode adjacent the antifuse. Any conductive material deposited immediately above the antifuse acts as an electrode. The TiN layer just deposited, then, is the first part of an electrode adjacent the antifuse.

To create the contact void where the zia is to be formed, the TiN hard mask and the dielectric between conductors, preferably $SiO_2$, need to be etched. This can be done using any pattern and etch technique. In one embodiment, a TiN etch can be performed in one chamber, then a $SiO_2$ etch can be performed in a second chamber. In another, TiN and $SiO_2$ are etched in a single chamber.

Figure 9:
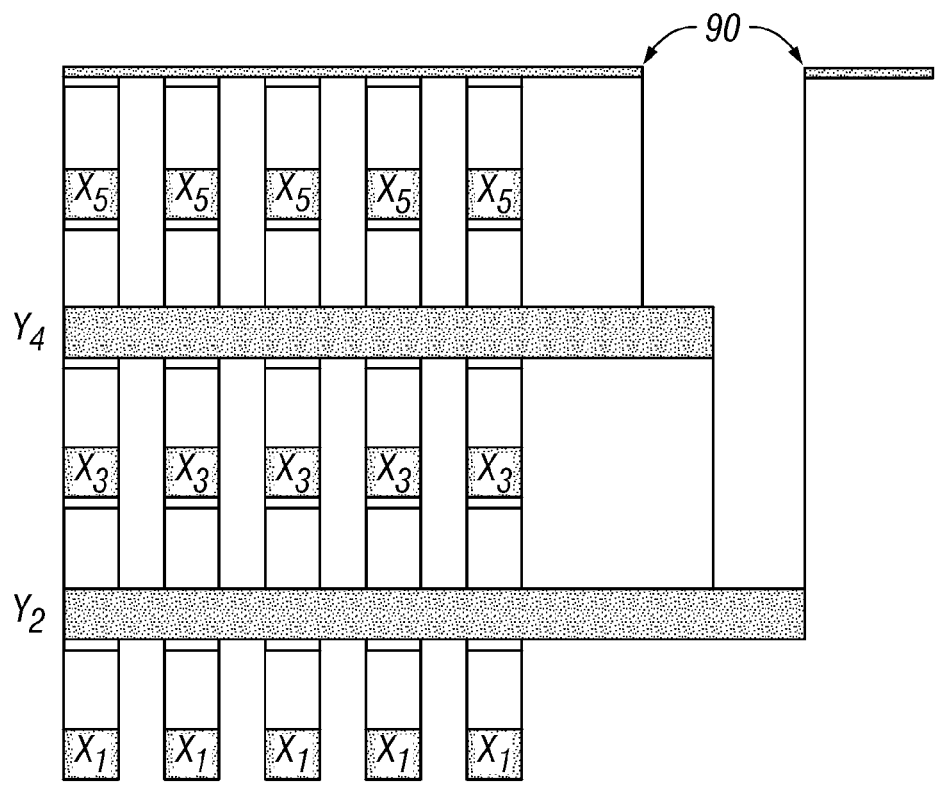

The resulting structure is shown in FIG. 9. The TiN hard mask 90 remains after the pattern and etch. A second TiN film can be deposited by any known method that will produce a conformal film; it will simultaneously line the volume etched for the zia and, together with the underlying TiN hard mask, form the bottom of the conductor. This second TiN film is the second part of an electrode adjacent the antifuse. Finally the tungsten conducting layer is deposited, completing deposition for the $Y_6$ conductors and formation of the zia. One sidewall of the zia has a stair-step profile. The $Y_6$ conductors are then patterned, etched, filled, and planarized as usual.

Alternately, for junction, top, or bottom antifuse, the conductors need not be staggered to form the landing pads shown in FIG. 8, and more conventional contacts can be formed instead, without a sidewall having a stair-step profile.

The current invention provides a method for creating a monolithic three dimensional memory array. The memory cells can be electrically connected in the embodiments described in Johnson et al. or Knall et al., but other arrangements can be envisaged as well.

EXAMPLE

A detailed description of one preferred embodiment of the present invention is provided below. Due to its cylindrical shape, in this description the semiconductor element is referred to as a "beer can." The bottom story of conductors or "wiring" will be referred to as X1, the one above it as Y2, the one above it as X3, etc. The bottom story of beer cans will be referred to as beer can 1, the one above as beer can 2, etc. This example describes creating a memory array with two stories of memory; memory arrays with more or fewer stories can be created.

Before creation of the monolithic three dimensional memory above the substrate begins, supporting circuitry, such as complementary metal oxide semiconductor (CMOS) transistors, may be created in the wafer. The steps detailed below begin with wafers processed though completion of CMOS transistors, and referred to as "the front end." The final step is the routing layer CMP. The routing layer is the conductive wiring connecting the CMOS transistors below, for example, to the memory cells above.

In the following description, the finished memory array includes $N^+$, $P^+$ and undoped polysilicon. Through all stages of deposition, photolithography, etch, and polish, all of these layers are referred to as polysilicon. In some embodiments, though, only the $P^+$ silicon is actually deposited as polysilicon, while the $N^+$ and undoped silicon are deposited as amorphous silicon and are crystallized into polysilicon by a final anneal, which also serves to activate dopants in the silicon.

Step 1: 200 Å TiN Deposition:

No preclean, or removal of native oxide, is performed prior to metal deposition. An appropriate deposition tool is the Applied Materials Endura, with a throughput of about 80 wafers per hour (WPH). Recipe: 200 Å (angstroms) IMP TiN (IMP is biased sputtering which produces more conformal films than non-biased sputtering). No bias is needed because no step coverage is required.

Step 2. 1500 Å Tungsten Deposition:

The tool used is the Novellus Concept One (throughput about 45 WPH). Recipe is as follows: Temperature is 445° C., pressure is 40 mTorr. Nucleation Step: 15 sccm $SiH_4$, 40 sccm $WF_6$, 1000 sccm Ar, 10000 sccm $H_2$, 5.5 sec. Via fill (per stage): 40 sccm $WF_6$, 9000 sccm Ar, 10000 sccm $H_2$, 6 sec. There are five stages total: one for nucleation and four for via fill, so via fill step is repeated four times.

Note: Low stress W is required. Stress: $\sigma=1.18\,E10$ dynes/$cm^2$. Sheet Resistance: 1500 Å W=1.3Ω/square.

Step 3: First Wiring Layer (X1) Photolithography:

Mask Dimensions: 0.15 μm line+0.17 μm space. Resist Coater: DNS. Scanner used is ASML /500 (40 WPH). 600 Å BARC—Shipley AR2. 4620 Å Shipley UV 135 Resist. PEB/soft bake temp=130° C./130° C. Exposure: 28 mJ/$cm^2$ (annular). Focus: 0.0 μm. DI CD Spec: Line CD: 0.16±0.02 μm. Dense to Isolated Bias: 0.04 μm. Overlay Spec: ±60 nm.

If using an ASM 5500/500 DUV scanner, use an N.A. setting of 0.63 (maximum available). Use annular illumination with an inner sigma setting of 0.50 and an outer sigma of 0.80. To accomplish 0.15 mm resolution with this tool, a $k_1$ value of 0.37 is necessary. This is at the limit of the /500's capability. Results will be much improved with a more capable photolithography tool. The severe proximity effects created by using the /500 are dealt with by a mask level adjustment to isolated lines. An extra 0.04 mm can be added to any side of a line that faces a space greater than 0.25 mm. This correction is process and photolithography tool specific. Because of the heavy use of chemical mechanical polishing (CMP) and opaque thin films in the back end of the process, most alignment and overlay marks below the top surface are filled in and invisible. ASML SPM (scribe line) marks are used for layer-to-layer alignment. Achieving the necessary step height for an alignment signal depends on the differential polishing rate between the patterned and fill materials.

Note that variation in CMP can directly affect alignment. As long as the CMP process is consistent and reproducible, good overlay can be maintained. If the process shifts, or cannot be controlled, a change in overlay will be seen. Typically, CMP induces rotational, and sometimes scaling, misalignment. Step 4: First Wiring Layer (X1) Etch:

Step 4a: Etch 1500 Å W and 200 Å TiN:

Etch tool used is LAM 9600 (35 WPH). Recipe: (Chuck Temp=45° C.). BARC: 12 mT/400 TCP/60 BP/50 $BCl_3$/25". W: 12 mT/600 TCP/100 BP/60 $SF_6$/11 $N_2$/15 $BCl_3$/Ept (~25")+25% OE. TiN: 8 mT/500 TCP/80 BP/30 $Cl_2$/50 $BCl_3$/20". The W etch rate is about 3600 Å/min.

Resist/BARC remaining after etch is about 500 Å. Oxide Gouge=~350 Å (dense); ~650 Å (isolated). Wall angle is 88-90°.

Step 4b: Plasma Strip:

Tool used is Gasonics (an alternative is 9600 Strip). Recipe: N2/O2 ash, 30 s, 270° C.

Step 4c: Post Strip Clean:

Tool used is Semitool. Recipe: EKC 265 Clean, 65° C., 10 min. Line CD is 0.15±0.02 μm. Dense to Isolated Bias is 25 nm. Dense lines shrink at etch by ~15 nm while isolated lines grow by 10 nm.

Need to clear any large unstepped areas to avoid tungsten peeling.

Step 5: X1 (First Wiring Layer) Fill:

2500 Å HDP oxide deposition is performed. No preclean is required. Deposition tool can be Novellus Speed, or AMAT HDP. Silane oxide deposition conditions correspond to an etch to deposition (E/D) ratio of about 0.25 in Novellus; equivalent AMAT HDP D/S ratio=3.2.

Gap is 0.17 μm tall and 0.17 μm wide, for an aspect ratio of 1:1. AMAT HDP is recommended to prevent alignment mark distortions.

Step 6: X1 CMP:

To perform CMP on HDP oxide, use Westech, with main polish rate about 2700 Å/min. AMAT Mirra can also be used. Ontrak DSS-200 with 1% $NH_4OH$ through the brush (no HF).

Consumables used for main polish are Cabot SC-1, IC1000/SubaIV, and SP1 CVD diamond conditioner disk. Consumables used for buff: Politex regular.

Recipe: Remove equivalent to 1600 Å on blanket TEOS wafer. 100 Å oxide removal occurs in final platen slurry buff.

There is minimal W loss, some rounding of corners, smoothing of grains. Politex platen-3 buff with slurry removes approximately 100 Å from blanket wafer after main polish. Oxide dishing occurs between W lines of about 200 Å to 300 Å. Center to edge variation (oxide loss) is 200 to 300 Å.

Step 7: Diode 0 (Beer Can 1) TiN Deposition:

To perform 200 Å TiN deposition, no preclean is needed. The tool used is AMAT Endura (80 WPH). Recipe is IMP TiN with bias; MOCVD or PVD TiN can be used. This layer is a barrier layer between W and polysilicon. It can be thinner, and is required to minimize leakage.

Step 8: Diode 0 (Beer Can 1) Polysilicon Deposition:

Deposit 200 Å $P^+$ polysilicon, 2900 Å undoped polysilicon, 800 Å $N^+$ polysilicon, and 200 Å undoped polysilicon. Tool used is ASML SVG. Recipe is 540° C., 400 mTorr. Remaining recipe conditions are shown in Table 1.

TABLE 1

| Step | Time | Silane | Helium | 1.5% $BCl_3$ | 1.5% $PH_3$ |
| --- | --- | --- | --- | --- | --- |
| 200 Å 1e21 $P^+$ Si | 5:00 | 500 sccm | 700 sccm | 100 sccm | — |

TABLE 1-continued

| Step | Time | Silane | Helium | 1.5% BCl$_3$ | 1.5% PH$_3$ |
|---|---|---|---|---|---|
| 2900 Å undoped Si | 2:22:40 | 500 sccm | — | — | — |
| 800 Å 5e20 N$^+$ Si | 1:08:00 | 500 sccm | 380 sccm | — | 40 sccm |
| 200 Å undoped Si | 10:45 | 500 sccm | — | — | — |

Dopants and concentration for in-situ doping: For P$^+$ dopant, use boron at $1.0 \times 10^{21}$ per cm$^3$; for N$^+$ dopant, use phosphorous at $5.0 \times 10^{20}$ per cm$^3$. Thickness variation within a wafer should be less than 2% (3 sigma); across a load, less than 3% (3 sigma); and from load to load, less than 2% (3 sigma).

600 Å of the N$^+$ polysilicon thickness and the undoped polysilicon can be sacrificial for CMP polishing. At least 200 Å of N$^+$ polysilicon is required for ohmic contact to subsequent TiN/W. Undoped polysilicon deposited as the last deposition eliminates autodoping, and can be removed in subsequent CMP step.

Alternatively, ion implantation can be used instead of in situ doping for the N$^+$ layer. Such implantation would be done after the beer can CMP.

Step 9: Diode 0 (Beer Can 1) Oxide Hard Mask Deposition:
Deposit 400 Å of oxide hard mask using a Novellus Oxide tool.

Hard mask is low temperature silane oxide. This hard mask is required if ASML /500 photolithography tool is used, but may not be necessary if a better tool is used. Hard mask improves silicon thickness uniformity after CMP, because hard mask deposition is more uniform than fill deposition.

Step 10: Diode 0 (Beer Can 1) Photolithography:
Use DNS resist coater and ASML /500 scanner or ASML/700 scanner. Deposit 900 Å BARC (or, alternately, DARC) and 4270 Å UV 135 resist. Perform PEB and soft bake at 130° C./130° C. Exposure is 20 mJ/cm$^2$. Focus: 0.0 µm.

The beer can ideal CD is 0.15±0.02 µm. Overlay specification is ±60 nm.

If the beer can mask is to be printed using ASML/500, it should be sized up to 0.17 µm and printed with about a 20 nm positive bias. If an ASML /700 scanner or better will be available, the mask may be printed with better fidelity.

Other problem associated with using /500 for 0.15 µm posts are: low resist thickness (about 3500 Å resist after develop) and poor profile warranting a hard mask at etch.

Misalignment can be tolerated. At nominal dimensions for beer cans and W conductors, contact area varies with misalignment as shown in Table 2:

TABLE 2

| Linear Misalignment | Contacted Area |
|---|---|
| +/−0 nm | 100% |
| +/−50 nm | 70% |
| +/−75 nm | 50% |
| +/−100 nm | 30% |
| +/−125 nm | 17% |

In the case of the wiring layers: X1, Y2, ..., X9, the polishing rate for tungsten is near zero so the CMP selectivity of tungsten to oxide is high. This makes it relatively easy to make a useable alignment mark. ASML specifies a target step height of 1200 Å. Experience has shown that for this process, any step height greater than 200 Å is sufficient to get good alignment. Between 40 Å and 200 Å, alignment may still work, but it is not reliable. Values greater than 200 Å are typically achieved for the wiring layers.

Step 11: Diode 0 (Beer Can 1) Etch:
Etch the following layers: 900 Å BARC, 400 Å Oxide, 200 Å undoped polysilicon, 800 Å N$^+$ polysilicon, 2900 Å undoped polysilicon, 200 Å P$^+$ polysilicon and 200 Å TiN. The etch tool used is 9400 DFM (44 wph for 4 chamber tool).

The following etch recipe is used (cathode Temp: 60° C.): For BARC, 5 mT/250 TCP/−200 BV/100 CF$_4$/Ept. For the hard mask, 5 mT/250 TCP/−200 BV/100 CF$_4$/20". Polysilicon main etch (ME): 10 mT/350 TCP/90 BP/40 Cl$_2$/150 HBr/15 He O$_2$/Ept (~100 s)+5% OE. Polysilicon over etch (OE): 80 mT/400 TCP/60 BP/100 HBr/200 He/19 He O$_2$/45". TiN: 5 mT/250 TCP/120 BP/10 Cl$_2$/50 HBr/50 He/30".

To perform the plasma resist strip, use the Novellus Iridia. The recipe is ~2.5% CF$_4$ in O$_2$, 1375 W MW, 50 W RF, 40° C., 105 s. 100% O$_2$, 0 W MW, 420 W RF, 40° C., 60 s.

The solvent clean tool is Semitool, and the recipe is EKC 265 Clean—10 minutes. The beer can CD is 0.21±0.03 µm. The CD is higher due to mask biasing. The ideal can CD is 0.17±0.02 µm. CD Bias: ~20 nm. relative to photolithography.

Gouge into W during OE is <100 Å, and gouge into oxide during over etch is <100 Å.

Polysilicon OE step is selective to TiN. CF4 containing ash with bias in Iridia helps clean up polymer without HF dip.

Step 12: Diode 0 (Beer Can 1) Fill:
For 4000 Å HDP Oxide Deposition (3 chambers; 60 WPH), use Novellus Speed or AMAT HDP. In the case of Novellus deposition, the E/D ratio=0.25; equivalent AMAT HDP D/S ratio=3.2.

Thickness should be 4100±200 Å. AMAT HDP is recommended since Novellus HDP fill causes asymmetry and thereby affecting alignment at photo.

Step 13: Diode 0 (Beer Can 1) CMP:
To CMP the HDP oxide, tools and consumables are the same as for the conductor polish in Step 6. Oxide removal target is 700 Å. Oxide hard mask must be removed from beer can structures. It is acceptable to leave undoped polysilicon on beer cans after polish. It is acceptable to leave unpolished oxide on other structures. After polish, the beer can must have a minimum of 200 Å of P$^+$ polysilicon remaining, such that total stack height is 3100 to 4300 Å after polish.

Polish times are very short for 700 Å target. Ramp-up plus buff steps remove approximately 250 Å. Main polish step is typically 9 to 10 seconds. The buff step, if used removes approximately 100 Å after main polish. Center to edge oxide loss variation is about 100 to 200 Å.

Step 14: Beer Can 1 Antifuse Growth:
18 Å of antifuse oxide must be grown. Perform preclean first: 100:1 HF dip; 45 s. Antifuse oxide growth is performed using an AG Associates RTP tool. Recipe is 650° C.; 60 s; Gases: 5 L O$_2$ and 5 L N$_2$. Thickness of the antifuse is 18±1 Å. Within wafer thickness uniformity should be less than 3% (1 sigma).

Maximum queue time between preclean and RTO is four hours. Queue time between RTO and Y2 TiN deposition appears not to be critical. AMAT RTO is an alternate tool.

RTO conditions will be adjusted based on diode e-test results (unprogrammed leakage current and time to breakdown).

Step 15: 200 Å TiN Deposition, Second Wiring Layer (Y2):
Tool used is Endura MOCVD or ULVAC PVD can be used. Recipe: IMP TiN without bias. The TiN deposition step should not have any pre-sputter clean or bias in order to protect the antifuse oxide. PVD or MOCVD TiN deposition can be used.

Step 16: 1500 Å W Deposition, Second Wiring Layer (Y2):

The Novellus W tool can be used. The recipe should be the same as X1 W deposition in Step 2 but for deposition time. Deposition time adjusted to target 1500 Å. TiN deposited without bias may make the W nucleation process sluggish, which is referred to as an incubation time, making the resulting W thickness lower compared to X1 step. W deposition on PVD or MOCVD TiN may behave differently.

Step 17: Y2 Photolithography—Second Wiring Layer Masking:

Photolithography conditions same as X1 photolithography conditions of Step 3 except dose of 27.5 mJ/cm$^2$. CD specification is 0.16±0.02 µm, and overlay specification is ±60 nm.

Step 18: Y2 Etch—Second Wiring Layer Etch:

1500 Å W and 200 Å TiN must be etched. Etch conditions are the same as X1 etch conditions described in Step 4. CD spec is 0.15±0.02 µm. Gouge into beer can 1 polysilicon is about 1400 Å.

Step 19: Y2 Fill:

2500 Å HDP oxide fill. Fill conditions are the same as for X1, described in Step 5.

Step 20: Y2 CMP:

CMP conditions same as for X1, describe in Step 6.

Step 21: Diode 1 (Beer Can 2) TiN Deposition.

The process to deposit 200 Å of TiN is the same as for beer can 1 TiN deposition, described in Step 7.

Step 22: Diode 1 (Upside Down Diode—Beer Can 2) Polysilicon Deposition:

To deposit 200 Å N$^+$ polysilicon, 2900 Å undoped polysilicon, 700 Å P$^+$ silicon, and 300 Å undoped silicon, use the ASML SVG tool. Recipe is 540° C., 400 mTorr, with remaining conditions detailed in Table 3:

TABLE 3

| Step | Time | Silane | Helium | 1.5% BCl$_3$ | 1.5% PH$_3$ |
|---|---|---|---|---|---|
| 200 Å 5e20 N$^+$ Si | 19:30 | 500 sccm | 380 sccm | — | 40 sccm |
| 2900 Å undoped Si | 2:22:40 | 500 sccm | — | — | — |
| 700 Å 1e21 P$^+$ Si | 15:00 | 500 sccm | 700 sccm | 100 sccm | — |
| 300 Å undoped Si | 15:45 | 500 sccm | — | — | — |

Dopant and concentration for in-situ doping, for N$^+$ should be phosphorous at 5.0 E20 per cm$^3$. For P$^+$, use boron at 1.0 E21 per cm$^3$. Thickness variation is the same as for beer can 1, as described in Step 8.

500 Å of the P$^+$ thickness and undoped polysilicon is sacrificial for CMP polishing. About 200 Å of N$^+$ and P$^+$ polysilicon is required for Ohmic contact to the underlying TiN/W. The undoped cap eliminates memory effect during deposition.

Alternatively, ion implantation can be used instead of in situ doping for the N$^+$ layer. Such implantation would be done after the beer can CMP.

Step 23: Diode 1 (Beer Can 2) Hard Mask Deposition:

To deposit a 400 Å hard mask oxide, the deposition conditions are the same as for beer can 1 hard mask, described in Step 9. This hard mask is needed to prevent poor photolithographic profile caused by scanner limitations from being transferred to the diode at etch. The hard mask also helps CMP.

Step 24: Diode 1 (Beer Can 2) Photolithography:

Beer can 2 photolithography is the same as beer can 1 photolithography, as described in Step 10.

Step 25: Beer Can 2 Etch:

Beer can 2 etch is the same as beer can 1 etch, as described in Step 11.

Step 26: BC2 (Beer Can 2) Fill:

Beer can 2 fill is the same as beer can 1 fill, as described in Step 12.

Step 27: Beer Can 2 CMP:

Beer can 2 CMP is the same as beer can 1 CMP, as described in Step 13.

Step 28: Beer Can 2 Antifuse Growth:

To grow 18 Å of antifuse oxide, perform a preclean: 100:1 HF, 45 s. Grow the antifuse using the AG Associates RTP. The recipe is 650° C., 5 l O$_2$, 5 l N$_2$, 60 s. In beer can 2, antifuse oxide is grown on P$^+$ polysilicon as opposed to on N$^+$ polysilicon in the case of beer can 1.

RTO conditions will be adjusted based on diode e-test results (unprogrammed leakage current and time to breakdown).

Step 29: X3 TiN 1 Deposition:

To deposit 300 Å of TiN, no preclean is required.

The tool and recipe for this TiN deposition are the same as for the Y2 TiN deposition, described in Step 15, except for the deposition time. The deposition time is compensated for increased thickness Plasma damage prevention is critical during TiN deposition in order to protect the antifuse. TiN is needed to protect the antifuse during zia etch and cleans. 300 Å of TiN is needed to protect the antifuse from being exposed during the TiN deposition prior to X3 W deposition.

Step 30: Zia 1 Photolithography:

Use 4620 Å of UV135 resist, and 600 Å of BARC. The scanner is the ASML/500 (NA/sigma: 0.48/0.36). Alternatively ASML/700 can be used instead. Expose conditions are 31 mJ/cm$^2$/–0.1 µm Focus. CD should be 0.21±0.02 µm. Overlay is ±75 nm. 0.21 µm wide zias are targeted. Three different zia lengths exist in the cell. Different lengths can be used depending on how many memory levels are to be contacted.

Step 31: Zia 1 Etch:

Etch 300 Å TiN and about 14000 Å oxide +25% OE. Etch tool is Centura MxP-eMax. Etch recipe for BARC/TiN Etch is Ar/CF$_4$/CHF$_3$ chemistry. For the oxide etch the recipe is Ar/C$_4$F$_6$/O$_2$ chemistry.

The CD specification is 0.21±0.025 µm (this is the top CD.) CD bias <10 nm (relative to photolithography for top CD.)

Regarding selectivity, resist loss during TiN etch is 500-600 Å. Oxide to resist selectivity is 6:1. Oxide to W selectivity is 100:1, so there is no noticeable W loss.

The wall angle is 88±1°. For resist strip, use Gasonics—O$_2$/N$_2$ ash; 270° C. Solvent clean is performed using Semitool 10 min EKC Clean.

Note BARC may not be needed on top of TiN. TEL DRM is an alternate tool for this process.

Zias are rectangular. Zias of three different lengths are present in the mask. Selectivity to W during zia etch is very good.

Step 32: X3 TiN 2 Deposition:

Perform the second TiN (200 Å) deposition at X3 using the AMAT Endura tool. The recipe: IMP TiN or, alternatively, MOCVD TiN.

Pre-sputter is equivalent to an oxide loss of 300 Å on a blanket oxide wafer, or a loss of 120 Å of TiN on a blanket TiN wafer.

Pre-sputter step is critical since it serves two competing purposes. That is, W surface at the bottom of the zia should be cleaned of native oxide while ensuring that the antifuse oxide is not exposed or damaged.

The total TiN thickness (TiN1+TiN2—pre-sputter) on the wafer is 350-400 Å at the end of this step.

Second TiN thickness can be reduced if MOCVD is used.

Step 33: X3 W Deposition:

For 2000 Å W Deposition, use Novellus CVD W tool. No preclean. Recipe is the same as X1 or Y2 W deposition except for time, which is adjusted for thickness target.

Note that W thickness is 2000 Å. This is required to fill 0.35 μm wide zias. If zia size is reduced to below 0.3 μm, W thickness can be reduced to 1500 Å, as in the case of X1 and Y2.

Step 34: X3 Photolithography:

Photolithography conditions and specifications are the same as that of Y2 photolithography steps, described in Step 17. CD specification is 0.16±0.02 μm; overlay specification is ±60 nm.

Step 35: X3 Etch: Etch 2000 Å of W and 400 Å of TiN:

Etch and clean conditions and specification are the same as those of X1 and Y2 etch steps. Etch times should be adjusted in W and TiN etch steps to account for increased thickness relative to X1 and Y2. Need to verify if resist thickness is sufficient to tolerate longer etch relative to X1 and Y.

Step 36: X3 Fill: Deposit 3000 Å of HDP Fill Oxide:

Same as X1 and Y2 fill except for thickness. Increased oxide thickness to account for increased W thickness.

Step 37: RTA: Final Anneal

Use the AG Associates RTA tool. Recipe is 770° C., 60 s; 10 liters Ar flow. The purpose is to crystallize silicon and activate dopant.

Step 38: X3 CMP:

Blanket wafer CMP removal target is 1700 Å. Other conditions are the same as X1 and Y2 CMP, described in Step 6.

Step 39: X3 Cap Oxide Deposition:

Deposit 5000 Å of Silane Oxide using Novellus tool. Recipe is Silane oxide. This need not be HDP oxide since it is a cap oxide on a CMPed surface. Can be AMAT oxide or Novellus.

Step 40: Final Zia Photolithography:

The final zia makes contact between top metal and memory layers.

Use ASML /500 (NA/sigma: 0.48/0.36). Photolithography conditions are the same as Z1 except dose of 30 mJ/cm². CD is 0.21±0.02 μm; overlay is ±75 nm.

Step 41: Final Zia Etch:

Etch 600 Å of BARC, 5000 Å of oxide +25% OE. Use Centura MxP eMax tool. Etch chemistry can be the same as Zia 1 etch described in Step 31. TiN etch step should be removed. Oxide etch time should be adjusted to target 8000 Å of oxide removal. Ash and solvent clean: same as zia 1. described in Step 31. CD Spec is 0.21±0.025 μm. Etch is straightforward and simple since the stack height is short and W is a good etch stop. Same recipe used for etching zia 1 can be used after removing TiN etch step and altering time to account for thickness difference.

Step 42: Final Zia TiN Deposition:

Use AMAT Endura tool. Recipe is 200 Å IMP TiN; MOCVD TiN can be used. Recipe conditions can be the same as the TiN deposition condition used for second TiN deposition at X3 deposition.

Step 43: go to Step 44.

Step 44: Final Zia W Deposition:

For 2000 Å W deposition, use the Novellus W tool.

The recipe is the same as for the X3 W deposition described in Step 33. Note that W thickness is 2000 Å. This is required to fill 0.35 μm zias. If zia size is reduced, W thickness can be reduced accordingly.

Step 45: Final Zia W CMP:

Use IPEC 472. Consumables are Rodel MSW 1500 ($KIO_3$—alumina) slurry, Politex main polish pad, no buff. Polish rate is about 3000 Å/min. Polish time is 90 seconds. Poor oxide selectivity; oxide loss is approximately 1000 to 1500 Å. Alternately, any via or contact W polishing recipes can be used instead.

Step 46: Top Metal Deposition:

Deposit 150 Å Ti, 4000 Å Al, 300 Å TiN. Use AMAT Endura tool. Recipe: Deposit 150 Å PVD Ti; Presputter is equivalent to 50 Å of oxide. Deposit 4000 Å PVD Al at 200° C. Deposit 300 Å PVD TiW. Any top metal stack conditions can be used.

Step 47: Top Metal Photolithography:

Use ASM11. Resist is JSR iX715 DM7 (1.2 μm). BARC: AR2. Photolithography conditions: 220 mJ/cm²/0.0 μm. CD is 1.0 um±0.1 μm.

Step 48: Top Metal Etch:

Tool: LAM 9600 PTX. Etch recipe is $Cl_2/BCl_3/SF_6$ BARC and TiW etch. $Cl_2/BCl_3$ Al etch, OE, and Ti etch.

Use standard plasma strip conditions. Solvent Clean tool is Semitool, 20 min EKC-265, 65° C.

Step 49: Alloy:

Use VTR Furnace. Recipe: Alloy at 400° C. and atmospheric pressure for 30 minutes in $N_2$ with about 5% $H_2$.

Periodic backside removal was found to be necessary to process the wafers through all the photo and etch steps. Stress measurements indicate linear increase in stress with layer number and stress relief with backside film removal. Backside polysilicon removal after every fourth polysilicon stack deposition would prevent any stress related processing problems and ensure sufficient process margin. Another option is to add backside polysilicon removal after every stack deposition starting with $P^+$ polysilicon (as in the case of beer can 1.) This would also alleviate defect concerns.

More backside etches may be necessary to meet particle performance.

Care must be taken in setting up the photolithography job such that photolithographic patterning leaves no part of the wafer unexposed (such as wafer scribe region). W peeling is typically seen in the alignment mark region and in big pads.

Thick oxide on W and excessive time at high temperature (greater than 700° C.) exacerbate W peeling problem.

The foregoing detailed description has described only a few of the many forms that this invention can take. For this reason, this detailed description is intended by way of illustration, and not by way of limitation. It is only the following claims, including all equivalents, which are intended to define the scope of this invention.

The invention claimed is:

1. A method to form a nonvolatile memory cell, the method comprising:
   i) forming a first conductor at a first height above a substrate;
   ii) forming a first pillar-shaped semiconductor element above the first conductor, wherein the first pillar-shaped semiconductor element comprises a first heavily doped layer of a first conductivity type, a second lightly doped layer above and in contact with the first heavily doped layer, and a third heavily doped layer of a second conductivity type above and in contact with the second lightly doped layer, the second conductivity type opposite the first conductivity type;

iii) forming a first antifuse above the third heavily doped layer of the first pillar-shaped semiconductor element; and iv) forming a second conductor above the first antifuse.

2. The method of claim 1, wherein forming the first semiconductor element comprises:

after forming the first conductor, depositing a semiconductor layer stack on the first conductor; and patterning and etching the semiconductor layer stack to form the first pillar-shaped semiconductor element.

3. The method of claim 2, wherein depositing the semiconductor layer stack comprises depositing polycrystalline silicon.

4. The method of claim 1, wherein the substrate comprises monocrystalline silicon.

5. The method of claim 1, wherein the first conductivity type is N-type and the second conductivity type is P-type.

6. The method of claim 1, wherein the first conductivity type is P-type and the second conductivity type is N-type.

7. The method of claim 1, wherein the third heavily doped layer is doped by ion implantation.

8. The method of claim 1, wherein the first heavily doped layer is doped by in situ doping.

9. The method of claim 1, wherein forming the first conductor comprises:

depositing a first tungsten layer; and patterning and etching the first tungsten layer to form the first conductor.

10. The method of claim 1, wherein the first antifuse comprises an oxide layer.

11. The method of claim 10, wherein the oxide layer comprises silicon dioxide.

* * * * *